US011878459B2

(12) United States Patent
Ren et al.

(10) Patent No.: US 11,878,459 B2
(45) Date of Patent: Jan. 23, 2024

(54) COMPOSITIONS AND ARTICLES FOR ADDITIVE FABRICATION AND METHODS OF USING THE SAME

(71) Applicant: STRATASYS INC., Eden Prairie, MN (US)

(72) Inventors: Kangtai Ren, Geneva, IL (US); Robin Papachristopoulos, Elgin, IL (US)

(73) Assignee: STRATASYS, INC., Eden Prairie, MN (US)

( * ) Notice: Subject to any disclaimer, the term of this patent is extended or adjusted under 35 U.S.C. 154(b) by 30 days.

(21) Appl. No.: 17/502,631

(22) Filed: Oct. 15, 2021

(65) Prior Publication Data
US 2022/0033553 A1 Feb. 3, 2022

Related U.S. Application Data

(63) Continuation of application No. 16/957,820, filed as application No. PCT/US2018/066346 on Dec. 19, 2018, now Pat. No. 11,180,594.

(60) Provisional application No. 62/612,157, filed on Dec. 29, 2017, provisional application No. 62/619,439, filed on Jan. 19, 2018.

(51) Int. Cl.
| | | |
|---|---|---|
| C08F 2/46 | (2006.01) | |
| C08F 2/50 | (2006.01) | |
| C08G 61/04 | (2006.01) | |
| B29C 64/106 | (2017.01) | |
| C09B 11/24 | (2006.01) | |
| G01P 5/20 | (2006.01) | |
| C08F 220/18 | (2006.01) | |
| B33Y 70/10 | (2020.01) | |
| B29C 64/135 | (2017.01) | |

(52) U.S. Cl.
CPC ............ *B29C 64/106* (2017.08); *B33Y 70/10* (2020.01); *C08F 220/18* (2013.01); *C09B 11/24* (2013.01); *G01P 5/20* (2013.01); *B29C 64/135* (2017.08)

(58) Field of Classification Search
CPC ........ G03F 7/027; G03F 7/0037; G03F 7/105; C08K 5/0041; G01M 9/08; C09B 11/24; B29C 64/16; B29C 64/135; C08F 2/50; C08F 220/18; C08F 222/1006; C08F 222/1025; G01P 5/20; B33Y 70/10
USPC ............. 522/26, 7, 6, 1, 71, 189, 184; 520/1
See application file for complete search history.

(56) References Cited

U.S. PATENT DOCUMENTS

| | | | |
|---|---|---|---|
| 3,708,499 A | 1/1973 | Andree et al. | |
| 3,767,358 A | 10/1973 | Stryker | |
| 3,849,065 A | 11/1974 | Schmeidl | |
| 5,470,816 A | 11/1995 | Satake et al. | |
| 6,031,021 A | 2/2000 | Kenny et al. | |
| 8,953,035 B2* | 2/2015 | Fukuchi | G01M 9/067 356/28 |
| 9,962,142 B2* | 5/2018 | Falahatpisheh | A61B 8/483 |
| 2003/0149124 A1 | 8/2003 | Thommes et al. | |
| 2005/0040562 A1 | 2/2005 | Steinmann et al. | |
| 2005/0101684 A1 | 5/2005 | You et al. | |
| 2006/0242910 A1 | 11/2006 | You | |
| 2010/0227941 A1* | 9/2010 | Ueda | G03F 7/027 522/170 |
| 2012/0251829 A1 | 10/2012 | Xu et al. | |
| 2013/0070062 A1 | 3/2013 | Fouras et al. | |
| 2015/0125702 A1 | 5/2015 | He et al. | |
| 2017/0275414 A1 | 9/2017 | Kwisnek et al. | |
| 2018/0264719 A1 | 9/2018 | Rolland et al. | |
| 2020/0223992 A1 | 7/2020 | Cushen et al. | |

FOREIGN PATENT DOCUMENTS

| | | |
|---|---|---|
| JP | 2006348214 A | 12/2006 |
| JP | 201736349 A | 2/2017 |
| WO | 2005045525 A1 | 5/2005 |
| WO | 2018119049 A1 | 6/2018 |

OTHER PUBLICATIONS

Aycock et al., "Particle image velocimetry measurements in an anatomical vascular model fabricated using inkjet 3D printing," Experiments in Fluid, vol. 58, No. 154, 2017.
Olasek et al., "Application of 3D printing technology in aerodynamic study," Journal of Physics: Conference Series, vol. 530, 2014.

* cited by examiner

*Primary Examiner* — Jessica Whiteley
(74) *Attorney, Agent, or Firm* — Faegre Drinker Biddle & Reath LLP

(57) ABSTRACT

Radiation curable compositions for additive fabrication processes, the components cured therefrom, and their use in particle image velocimetry testing methods are described and claimed herein. Such compositions include compounds which induce free-radical polymerization, optionally compounds which induce cationic polymerization, a filler constituent, and a light absorbing component, wherein the compositions are configured to possess certain absorbance values at wavelengths commonly utilized in particle image velocimetry testing. In another embodiment, the compositions include a fluoroantimony-modified compound. Such compositions may be used in particle imaging velocimetry testing methods, wherein the test object utilized is created via additive fabrication and is of a substantially homogeneous construction.

19 Claims, 1 Drawing Sheet

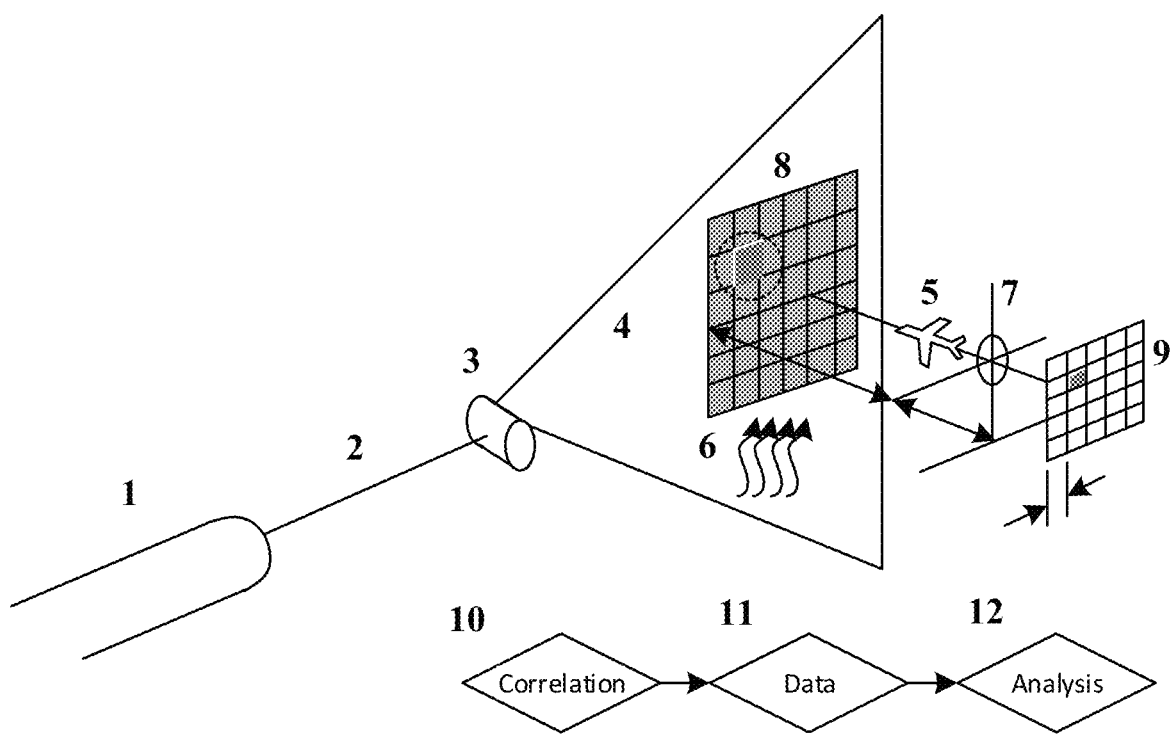

COMPOSITIONS AND ARTICLES FOR ADDITIVE FABRICATION AND METHODS OF USING THE SAME

CROSS-REFERENCE TO RELATED APPLICATIONS

This application is a continuation of U.S. patent application Ser. No. 16/957,820, which itself is a U.S. national phase entry under 35 USC § 371 on 25 Jun. 2020 of international application PCT/US2018/066346, filed 19 Dec. 2018, which designated the U.S. and which claims priority to U.S. Provisional Application No. 62/612,157, filed 29 Dec. 2017, and U.S. Provisional Application No. 62/619,439, filed 19 Jan. 2018, the entire contents of each of which is hereby incorporated by reference in its entirety.

TECHNICAL FIELD

The present invention relates to radiation curable compositions for additive fabrication processes, the components cured therefrom, and their use in particle image velocimetry testing methods.

BACKGROUND

Additive fabrication processes for producing three dimensional objects are well known. Additive fabrication processes utilize computer-aided design (CAD) data of an object to build three-dimensional parts. These three-dimensional parts may be formed from liquid resins, powders, or other materials.

A non-limiting example of an additive fabrication process is stereolithography (SL). Stereolithography is a well-known process for rapidly producing models, prototypes, patterns, and production parts in certain applications. SL uses CAD data of an object wherein the data is transformed into thin cross-sections of a three-dimensional object. The data is loaded into a computer which controls a laser that traces a pattern of a cross section through a radiation curable composition contained in a vat, solidifying a thin layer of the resin corresponding to the cross section. The solidified layer is recoated with resin and the laser traces another cross section to harden another layer of resin on top of the previous layer. The process is repeated layer by layer until the three-dimensional object is completed. When initially formed, the three-dimensional object is, in general, not fully cured, and is called a "green model." Although not required, the green model may be subjected to post-curing to enhance the mechanical properties of the finished part. An example of an SL process is described in U.S. Pat. No. 4,575,330, which is hereby incorporated by reference.

There are several types of lasers used in stereolithography, traditionally ranging from 193 nm to 355 nm in wavelength, although other wavelength variants exist. The use of gas lasers to cure radiation curable composition compositions is well known. The delivery of laser energy in a stereolithography system can be Continuous Wave (CW) or Q-switched pulses. CW lasers provide continuous laser energy and can be used in a high-speed scanning process. However, their output power is limited which reduces the amount of curing that occurs during object creation. As a result, the finished object will need additional post process curing. In addition, excess heat could be generated at the point of irradiation which may be detrimental to the resin. Further, the use of a laser requires scanning point by point on the resin which can be time-consuming.

Other methods of additive fabrication utilize lamps or light emitting diodes (LEDs). LEDs are semiconductor devices which utilize the phenomenon of electroluminescence to generate light. At present, LED UV light sources currently emit light at wavelengths between 300 and 475 nm, with 365 nm, 390 nm, 395 nm, 405 nm, and 415 nm being common peak spectral outputs. See textbook, "Light-Emitting Diodes" by E. Fred Schubert, $2^{nd}$ Edition, © E. Fred Schubert 2006, published by Cambridge University Press, for a more in-depth discussion of LED UV light sources.

Many additive fabrication applications require a freshly-cured part, aka the "green model" to possess high mechanical strength (modulus of elasticity, fracture strength). This property, often referred to as "green strength," constitutes an important property of the green model and is determined essentially by the nature of the radiation curable composition employed in combination with the type of apparatus used and degree of exposure provided during part fabrication. Other important properties of a stereolithographic composition include: high sensitivity for the radiation employed in the course of curing, and a minimum amount of curl or shrinkage deformation, permitting high shape definition of the green model. Of course, not only the green model but also the final cured article should have sufficiently optimized mechanical properties.

For select additive fabrication applications in the aerospace or automotive industries, for example, three-dimensional solid parts are subjected to the high force loads of a wind tunnel, or the extreme temperatures of a location proximate to heat-generating componentry. In such applications, designers and engineers require a three-dimensional solid part created via additive fabrication to maintain its structural integrity and minimize deflection. Thus, three-dimensional parts made from photopolymerizable compositions must possess ceramic-like material properties, such as high strength, stiffness, and heat resistance.

"Filled" radiation curable compositions have long been used in the field in an attempt to meet these specialized application design criteria. That is, high amounts of inorganic filler, such as silica ($SiO_2$) have been imparted into traditional "unfilled" radiation curable compositions due to the filler's positive impact on the strength and stiffness of the three-dimensional object produced therefrom. Such filled liquid radiation curable compositions are known in the art of additive fabrication, and are disclosed in, e.g., U.S. Pat. No. 9,228,073, assigned to DSM IP Assets B.V.

As noted, highly filled stereolithography (SL) products produce strong, stiff, high temperature resistant composite parts that have been widely utilized in wind tunnel testing. Over the past years, certain post-processed highly filled parts created via SL have been extensively used in particle image velocimetry testing in the wind tunnel to increase R&D efficiency. Before a particle image velocimetry test, SL parts are specially prepared to reduce surface reflection when hit by the high intensity green laser. It usually takes hours or days to prepare the parts, and existing intrusive methods of surface-treating SL parts may not always facilitate accurate results due to the sensitive test conditions and environment under which such parts are evaluated.

Particle image velocimetry (PIV) is a quantitative method which uses a combination of a high intensity light source, digital cameras, and seed particles commonly known as tracers to provide an accurate velocity measurement of the flow field being studied. The method is well-known, as described in *Particle Image Velocimetry: A Practical Guide;* $2^{nd}$ Ed. (2007); by Markus Raffel, Christian E. Willert, Steven T. Wereley, and Jurgen Kompenhans. The flow is typically seeded with neutrally buoyant particles which closely represents the fluid (typically air). A bright light, such as from a high-powered laser, is then used in conjunction with one or more digital cameras to collect two images with a small separation time. These images are then either cross-correlated or auto-correlated, and the resulting calculations yield velocity vectors. PIV may be said to be a consequence of the development of flow visualization techniques, which have contributed so importantly to the understanding of fluid flow phenomena. Flow visualization probably always played an important role in the study of fluid motion.

PIV testing has been used to facilitate improvements in aerodynamic designs of aero-sensitive objects since at least 2006. Such tests were used in wind-tunnel applications to facilitate the visualization of air flow behavior and to study the aerodynamic effect of SL-fabricated prototype parts. As such, permanent PIV test equipment have been affixed to wind tunnels for at least 10 years in the auto racing industry. Over the past decade, racing engineers have used such systems intensively to boost R&D efficiency to produce cars with ever-increasing amounts of downforce.

A common concern during PIV testing is surface reflection produced by the high intensity laser necessarily used therein. The severity of the reflection is influenced partially by the material being used, the intensity of the light source, and the application of image filtering. The material selected can have a predominant effect on the severity of the surface reflection. The high surface reflection alters the PIV test data near the surface of the part, making the image appear blurred. Engineers have heretofore not been able to directly apply SL parts for PIV testing due to their inherently highly reflective surface. Engineers usually post-treat the surface of SL parts by wrapping up parts with special metal foil or painting the surface of the parts, to ensure they work well in the PIV test. The post treatment is time-consuming, and usually induces new challenges depending on treatment method employed.

Painting or "foiling" SL parts are currently the most popular treatment methods. In order to enable these methods, surface imperfections on the SL parts must first be eliminated in a manually-intensive sanding process. Then, a metal foil or coating, such as matte black or orange paint, is typically applied or sprayed onto the surface and allowed to dry. The paint may contain hazardous chemicals, and the uniformity of paint thickness is difficult to control when the shape or geometry of SL parts becomes complicated. Furthermore, the paint layer can sometimes partially wear off during testing or handling. Meanwhile, the precise application of foil is arduous and requires great skill to apply to the part without causing bubbles or surface imperfections to the part. In any event, known methods compromise the dimensional fidelity of the test part, thereby introducing the possibility of error when determining the actual wind flow around the prototype aerodynamic component. Despite test parts created via additive fabrication methods being used in such PIV tests for years, heretofore none exist which eliminate the need for time-consuming post processing involving potentially hazardous chemicals and which compromise the accuracy of the precisely fabricated SL part.

From the foregoing, it is evident that no radiation curable compositions for additive fabrication exist that are suitable for producing cured components having adequate application-specific heat resistance and structural rigidity, while overcoming the long-felt but unsolved industry needs of providing a resin which is capable of producing parts that enable precise PIV testing without need for post-processing, and yet are still sufficiently fast-curing to be suitable for use in additive fabrication processes.

BRIEF SUMMARY

The aforementioned problems are overcome by aspects of the current invention herein described and claimed. A first aspect of the claimed invention is a process of performing a particle imaging velocimetry test using an object created via additive fabrication, the method comprising:
  providing a test component created via additive fabrication; immersing the test component in a flow field seeded with tracer particles;
  illuminating at least a portion of said seeded flow field proximate to said component with light of a first wavelength;
  capturing a plurality of images using an imaging system; evaluating said images to determine flow vectors proximate to the test component;
  wherein the test component is uncoated, unfoiled, and unpainted.

A second aspect of the claimed invention is a radiation curable composition for additive fabrication, comprising:
  a free-radically polymerizable component;
  a free-radical photoinitiator;
  a filler constituent;
  and a light absorbing component;
  wherein the composition is configured to possess an absorbance at 532 nm of at least 10, or at least 15, or at least 20, or at least 25, or at least 30, or from 10-1000, or from 15-500, or from 20-200, or from 25-150, or from 30-100, or from 30-80, or from 35-75.

A third aspect of the claimed invention is a radiation curable composition for additive fabrication, comprising, relative to the weight of the entire composition:
  a. from 25-65 wt. % of a filler constituent;
  b. from 10-50 wt. % of a cationically polymerizable constituent;
  c. from 5-40 wt. % of a free-radically polymerizable constituent;
  d. an effective amount of a cationic photoinitiator;
  e. an effective amount of a free-radical photoinitiator; and
  f. a light absorbing component.

BRIEF DESCRIPTION OF THE DRAWINGS

FIG. 1 depicts a particle image velocimetry test setup into which articles formed from compositions according to the present invention may be incorporated.

DETAILED DESCRIPTION

As used herein, "substantially homogeneous construction" means an object that is of a substantially uniform appearance and composition. For purposes herein, components created via vat-based additive fabrication processes, such as stereolithography, are herein considered to be non-limiting examples of a component having a "substantially homogeneous construction," even if such parts are the cured product of resins comprising a suspension of solid particles (such as nanosilica) dispersed in a liquid resin. Examples of objects that would not, for purposes herein, be considered to be of a "substantially homogeneous construction," include parts which are post-processed by painting the cured object, or those to which a metal foil is affixed to at least a portion of the exterior surface of the cured object.

A first aspect of the claimed invention is a process of performing a particle imaging velocimetry test using an object created via additive fabrication, the method comprising:

providing a test component created via additive fabrication; immersing the test component in a flow field seeded with tracer particles;

illuminating at least a portion of said seeded flow field proximate to said component with light of a first wavelength;

capturing a plurality of images using an imaging system; evaluating said images to determine flow vectors proximate to the test component;

wherein the test component is uncoated, unfoiled, and unpainted.

A second aspect of the claimed invention is a radiation curable composition for additive fabrication, comprising:

a free-radically polymerizable component;
a free-radical photoinitiator;
a filler constituent;
and a light absorbing component;

wherein the composition is configured to possess an absorbance at 532 nm of at least 10, or at least 15, or at least 20, or at least 25, or at least 30, or from 10-1000, or from 15-500, or from 20-200, or from 25-150, or from 30-100, or from 30-80, or from 35-75.

A third aspect of the claimed invention is a radiation curable composition for additive fabrication, comprising, relative to the weight of the entire composition:

a. from 25-65 wt. % of a filler constituent;
b. from 10-50 wt. % of a cationically polymerizable constituent;
c. from 5-40 wt. % of a free-radically polymerizable constituent;
d. an effective amount of a cationic photoinitiator;
e. an effective amount of a free-radical photoinitiator; and
f. a light absorbing component.

Cationically Polymerizable Component

In accordance with some preferred embodiments, the radiation curable compositions for additive fabrication of the invention comprise at least one cationically polymerizable component; that is a component which undergoes polymerization initiated by cations or in the presence of acid generators. The cationically polymerizable components may be monomers, oligomers, and/or polymers, and may contain aliphatic, aromatic, cycloaliphatic, arylaliphatic, heterocyclic moiety(ies), and any combination thereof. Suitable cyclic ether compounds can comprise cyclic ether groups as side groups or groups that form part of an alicyclic or heterocyclic ring system.

The cationic polymerizable component is selected from the group consisting of cyclic ether compounds, cyclic acetal compounds, cyclic thioethers compounds, spiro-orthoester compounds, cyclic lactone compounds, and vinyl ether compounds, and any combination thereof.

Suitable cationically polymerizable components include cyclic ether compounds such as epoxy compounds and oxetanes, cyclic lactone compounds, cyclic acetal compounds, cyclic thioether compounds, spiro-orthoester compounds, and vinyl ether compounds. Specific examples of cationically polymerizable components include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resins, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexanecarboxylate, 2-(3,4-epoxycyclohexyl-5,5-spiro-3,4-epoxy)-cyclohexane-1,4-dioxane, bis(3,4-epoxycyclohexylmethyl) adipate, vinyl cyclohexene oxide, 4-vinylepoxycyclohexane, vinyl cyclohexene dioxide, limonene oxide, limonene dioxide, bis(3,4-epoxy-6-methylcyclohexylmethyl)adipate, 3,4-epoxy-6-methylcyclohexyl-3',4'-epoxy-6'-methylcyclohexanecarboxylate, ε-caprolactone-modified 3,4-epoxycyclohexylmethyl-3',4'-epoxycyclohexane carboxylates, trimethylcaprolactone-modified 3,4-epoxycyclohexylmethyl-3',4'-epoxycyclohexane carboxylates, β-methyl-δ-valerolactone-modified 3,4-epoxycyclohexylmethyl-3',4'-epoxycyclohexane carboxylates, methylenebis(3,4-epoxycyclohexane), bicyclohexyl-3,3'-epoxide, bis(3,4-epoxycyclohexyl) with a linkage of —O—, —S—, —SO—, —SO$_2$—, —C(CH$_3$)$_2$—, —CBr$_2$—, —C(CBr$_3$)$_2$—, —C(CF$_3$)$_2$—, —C(CCl$_3$)$_2$—, or —CH(C$_6$H$_5$)—, dicyclopentadiene diepoxide, di(3,4-epoxycyclohexylmethyl) ether of ethylene glycol, ethylenebis(3,4-epoxycyclohexanecarboxylate), epoxyhexahydrodioctylphthalate, epoxyhexahydro-di-2-ethylhexyl phthalate, 1,4-butanediol diglycidyl ether, 1,6-hexanediol diglycidyl ether, neopentylglycol diglycidyl ether, glycerol triglycidyl ether, trimethylolpropane triglycidyl ether, polyethylene glycol diglycidyl ether, polypropylene glycol diglycidyl ether, diglycidyl esters of aliphatic long-chain dibasic acids, monoglycidyl ethers of aliphatic higher alcohols, monoglycidyl ethers of phenol, cresol, butyl phenol, or polyether alcohols obtained by the addition of alkylene oxide to these compounds, glycidyl esters of higher fatty acids, epoxidated soybean oil, epoxybutylstearic acid, epoxyoctylstearic acid, epoxidated linseed oil, epoxidated polybutadiene, 1,4-bis[(3-ethyl-3-oxetanylmethoxy)methyl]benzene, 3-ethyl-3-hydroxymethyloxetane, 3-ethyl-3-(3-hydroxypropyl)oxymethyloxetane, 3-ethyl-3-(4-hydroxybutyl)oxymethyloxetane, 3-ethyl-3-(5-hydroxypentyl)oxymethyloxetane, 3-ethyl-3-phenoxymethyloxetane, bis((1-ethyl(3-oxetanyl))methyl)ether, 3-ethyl-3-((2-ethylhexyloxy)methyl)oxetane, 3-ethyl-((triethoxysilylpropoxymethyl)oxetane, 3-(meth)-allyloxymethyl-3-ethyloxetane, 3-hydroxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]-benzene, [1-(3-ethyl-3-oxetanylmethoxy)ethyl]phenyl ether, isobutoxymethyl(3-ethyl-3-oxetanylmethyl)ether, 2-ethylhexyl(3-ethyl-3-oxetanylmethyl) ether, ethyldiethylene glycol(3-ethyl-3-oxetanylmethyl) ether, dicyclopentadiene (3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuyl(3-ethyl-3-oxetanylmethyl)ether, 2-hydroxyethyl (3-ethyl-3-oxetanylmethyl)ether, 2-hydroxypropyl(3-ethyl-3-oxetanylmethyl)ether, and any combination thereof.

The cationically polymerizable component may optionally also contain polyfunctional materials including dendritic polymers such as dendrimers, linear dendritic polymers, dendrigraft polymers, hyperbranched polymers, star branched polymers, and hypergraft polymers with epoxy or oxetane functional groups. The dendritic polymers may contain one type of polymerizable functional group or different types of polymerizable functional groups, for example, epoxy and oxetane functions.

In an embodiment, the composition of the present invention also comprises one or more mono or poly glycidylethers of aliphatic alcohols, aliphatic polyols, polyesterpolyols or polyetherpolyols. Examples of preferred components include 1,4-butanedioldiglycidylether, glycidylethers of polyoxyethylene and polyoxypropylene glycols and triols of molecular weights from about 200 to about 10,000; glycidylethers of polytetramethylene glycol or poly(oxyethyleneoxybutylene) random or block copolymers. In a specific embodiment, the cationically polymerizable component comprises a polyfunctional glycidylether that lacks a cyclohexane ring in the molecule. In another specific embodiment, the cationically polymerizable component includes a neopentyl glycol diglycidyl ether. In another specific embodiment, the cationically polymerizable component includes a 1,4 cyclohexanedimethanol diglycidyl ether.

Examples of commercially available preferred polyfunctional glycidylethers are Erisys™ GE 22 (Erisys™ products are available from Emerald Performance Materials™) Heloxy™ 48, Heloxy™ 67, Heloxy™ 68, Heloxy™ 107 (Heloxy™ modifiers are available from Momentive Specialty Chemicals), and Grilonit® F713. Examples of commercially available preferred monofunctional glycidylethers are Heloxy™ 71, Heloxy™ 505, Heloxy™ 7, Heloxy™ 8, and Heloxy™ 61.

In an embodiment, the epoxide is 3,4-epoxycyclohexylmethyl-3',4-epoxycyclohexanecarboxylate (available as CELLOXIDE™ 2021P from Daicel Chemical, or as CYRACURE™ UVR-6105 from Dow Chemical), hydrogenated bisphenol A-epichlorohydrin based epoxy resin (available as EPON™ 1510 from Momentive), 1,4-cyclohexanedimethanol diglycidyl ether (available as HELOXY™ 107 from Momentive), a hydrogenated bisphenol A diglycidyl ether (available as EPON™ 825 from Momentive) a mixture of dicyclohexyl diepoxide and nanosilica (available as NANOPDX™), and any combination thereof.

The above-mentioned cationically polymerizable compounds can be used singly or in combination of two or more thereof. In some embodiments of the invention, the cationic polymerizable component further comprises at least two different epoxy components. In a specific embodiment, the cationic polymerizable component includes a cycloaliphatic epoxy, for example, a cycloaliphatic epoxy with 2 or more than 2 epoxy groups. In another specific embodiment, the cationic polymerizable component includes an epoxy having an aromatic or aliphatic glycidyl ether group with 2 (difunctional) or more than 2 (polyfunctional) epoxy groups.

The radiation curable composition for additive fabrication can therefore include suitable amounts of the cationic polymerizable component, for example, in certain embodiments, in an amount from about 10 to about 80% by weight of the composition, in further embodiments from about 20 to about 70 wt. % of the composition, and in further embodiments from about 25 to about 65 wt. % of the composition.

In other embodiments of the invention, the cationic polymerizable component also optionally comprises an oxetane component. In a specific embodiment, the cationic polymerizable component includes an oxetane, for example, an oxetane containing 1, 2 or more than 2 oxetane groups. If utilized in the composition, the oxetane component is present in a suitable amount from about 5 to about 30 wt. % of the composition. In another embodiment, the oxetane component is present in an amount from about 10 to about 25 wt. % of the composition, and in yet another embodiment, the oxetane component is present in an amount from 20 to about 30 wt. % of the composition.

In accordance with an embodiment, the radiation curable composition for additive fabrication contains a component that is polymerizable by both free-radical polymerization and cationic polymerization. An example of such a polymerizable component is a vinyloxy compound, for example, one selected from the group consisting of bis(4-vinyloxybutyl)isophthalate, tris(4-vinyloxybutyl) trimellitate, and combinations thereof. Other examples of such a polymerizable component include those containing an acrylate and an epoxy group, or an acrylate and an oxetane group, on a same molecule.

Radically Polymerizable Component

In accordance with a preferred embodiment of the invention, the radiation curable composition for additive fabrication of the invention comprises at least one free-radical polymerizable component, that is, a component which undergoes polymerization initiated by free radicals. The free-radical polymerizable components are monomers, oligomers, and/or polymers; they are monofunctional or polyfunctional materials, i.e., have 1, 2, 3, 4, 5, 6, 7, 8, 9, 10 . . . 20 . . . 30 . . . 40 . . . 50 . . . 100, or more functional groups that can polymerize by free radical initiation, may contain aliphatic, aromatic, cycloaliphatic, arylaliphatic, heterocyclic moiety(ies), or any combination thereof. Examples of polyfunctional materials include dendritic polymers such as dendrimers, linear dendritic polymers, dendrigraft polymers, hyperbranched polymers, star branched polymers, and hypergraft polymers; see, e.g., US 2009/0093564 A1. The dendritic polymers may contain one type of polymerizable functional group or different types of polymerizable functional groups, for example, acrylates and methacrylate functions.

Examples of free-radical polymerizable components include acrylates and methacrylates such as isobornyl (meth) acrylate, bornyl (meth)acrylate, tricyclodecanyl (meth)acrylate, dicyclopentanyl (meth)acrylate, dicyclopentenyl (meth)acrylate, cyclohexyl (meth)acrylate, benzyl (meth) acrylate, 4-butylcyclohexyl (meth)acrylate, acryloyl morpholine, (meth)acrylic acid, 2-hydroxyethyl (meth)acrylate, 2-hydroxypropyl (meth)acrylate, 2-hydroxybutyl (meth) acrylate, methyl (meth)acrylate, ethyl (meth)acrylate, propyl (meth)acrylate, isopropyl (meth)acrylate, butyl (meth)acrylate, amyl (meth)acrylate, isobutyl (meth)acrylate, t-butyl (meth)acrylate, pentyl (meth)acrylate, caprolactone acrylate, isoamyl (meth)acrylate, hexyl (meth)acrylate, heptyl (meth) acrylate, octyl (meth)acrylate, isooctyl (meth)acrylate, 2-ethylhexyl (meth)acrylate, nonyl (meth)acrylate, decyl (meth)acrylate, isodecyl (meth)acrylate, tridecyl (meth) acrylate, undecyl (meth)acrylate, lauryl (meth)acrylate, stearyl (meth)acrylate, isostearyl (meth)acrylate, tetrahydrofurfuryl (meth)acrylate, butoxyethyl (meth)acrylate, ethoxydiethylene glycol (meth)acrylate, benzyl (meth)acrylate, phenoxyethyl (meth)acrylate, polyethylene glycol mono(meth)acrylate, polypropylene glycol mono(meth) acrylate, methoxyethylene glycol (meth)acrylate, ethoxyethyl (meth)acrylate, methoxypolyethylene glycol (meth) acrylate, methoxypolypropylene glycol (meth)acrylate, diacetone (meth)acrylamide, beta-carboxyethyl (meth)acrylate, phthalic acid (meth)acrylate, dimethylaminoethyl (meth)acrylate, diethylaminoethyl (meth)acrylate, butylcarbamylethyl (meth)acrylate, n-isopropyl (meth)acrylamide fluorinated (meth)acrylate, 7-amino-3,7-dimethyloctyl (meth)acrylate.

Examples of polyfunctional free-radical polymerizable components include those with (meth)acryloyl groups such as trimethylolpropane tri(meth)acrylate, pentaerythritol (meth)acrylate, ethylene glycol di(meth)acrylate, bisphenol A diglycidyl ether di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate; 3,9-bis(1,1-dimethyl-2-hydroxyethyl)-2,4,8,10-tetraoxaspiro [5.5]undecane di(meth)acrylate; dipentaerythritol monohydroxypenta(meth)acrylate, propoxylated trimethylolpropane tri(meth)acrylate, propoxylated neopentyl glycol di(meth)acrylate, tetraethylene glycol di(meth)acrylate, polyethylene glycol di(meth)acrylate, 1,4-butanediol di(meth)acrylate, 1,6-hexanediol di(meth)acrylate, neopentyl glycol di(meth)acrylate, polybutanediol di(meth)acrylate, tripropyleneglycol di(meth)acrylate, glycerol tri(meth)acrylate, phosphoric acid mono- and di(meth)acrylates, $C_7$-$C_{20}$ alkyl di(meth)acrylates, tris(2-hydroxyethyl)isocyanurate tri(meth)acrylate, tris(2-hydroxyethyl)isocyanurate di(meth)acrylate, pentaerythritol tri(meth)acrylate, pentaerythritol tetra(meth)acrylate, dipentaerythritol hexa(meth)acrylate, tricyclodecane diyl dimethyl di(meth)acrylate and alkoxylated versions (e.g., ethoxylated and/or propoxylated) of any of the preceding monomers, and also di(meth)acrylate of a diol which is an ethylene oxide or propylene oxide adduct to bisphenol A, di(meth)acrylate of a diol which is an ethylene oxide or propylene oxide adduct to hydrogenated bisphenol A, epoxy (meth)acrylate which is a (meth)acrylate adduct to bisphenol A of diglycidyl ether, diacrylate of polyoxyalkylated bisphenol A, and triethylene glycol divinyl ether, and adducts of hydroxyethyl acrylate.

In accordance with an embodiment, the radically polymerizable component is a polyfunctional (meth)acrylate. The polyfunctional (meth)acrylates may include all methacryloyl groups, all acryloyl groups, or any combination of methacryloyl and acryloyl groups. In an embodiment, the free-radical polymerizable component is selected from the group consisting of bisphenol A diglycidyl ether di(meth)acrylate, ethoxylated or propoxylated bisphenol A or bisphenol F di(meth)acrylate, dicyclopentadiene dimethanol di(meth)acrylate, [2-[1,1-dimethyl-2-[(1-oxoallyl)oxy]ethyl]-5-ethyl-1,3-dioxan-5-yl]methyl acrylate, dipentaerythritol monohydroxypenta(meth)acrylate, dipentaerythritol penta(meth)acrylate, dipentaerythritol hexa(meth)acrylate, propoxylated trimethylolpropane tri(meth)acrylate, and propoxylated neopentyl glycol di(meth)acrylate, and any combination thereof.

In a preferred embodiment, the polyfunctional (meth)acrylate has more than 2, more preferably more than 3, and more preferably greater than 4 functional groups.

In another preferred embodiment, the radically polymerizable component consists exclusively of a single polyfunctional (meth)acrylate component. In further embodiments, the exclusive radically polymerizable component is tetra-functional, in further embodiments, the exclusive radically polymerizable component is penta-functional, and in further embodiments, the exclusive radically polymerizable component is hexa-functional.

In another embodiment, the free-radical polymerizable component is selected from the group consisting of bisphenol A diglycidyl ether diacrylate, dicyclopentadiene dimethanol diacrylate, [2-[1,1-dimethyl-2-[(1-oxoallyl)oxy]ethyl]-5-ethyl-1,3-dioxan-5-yl]methyl acrylate, dipentaerythritol monohydroxypentaacrylate, propoxylated trimethylolpropane triacrylate, and propoxylated neopentyl glycol diacrylate, and any combination thereof.

In specific embodiments, the radiation curable compositions for additive fabrication of the invention include one or more of bisphenol A diglycidyl ether di(meth)acrylate, dicyclopentadiene dimethanol di(meth)acrylate, dipentaerythritol monohydroxypenta(meth)acrylate, propoxylated trimethylolpropane tri(meth)acrylate, and/or propoxylated neopentyl glycol di(meth)acrylate, and more specifically one or more of bisphenol A diglycidyl ether diacrylate, dicyclopentadiene dimethanol diacrylate, dipentaerythritol pentaacrylate, propoxylated trimethylolpropane triacrylate, and/or propoxylated neopentyl glycol diacrylate.

The above-mentioned radically polymerizable compounds can be used singly or in combination of two or more thereof. The radiation curable composition for additive fabrication can include any suitable amount of the free-radical polymerizable components, for example, in certain embodiments, in an amount up to about 40 wt. % of the composition, in certain embodiments, from about 2 to about 40 wt. % of the composition, in other embodiments from about 5 to about 30 wt. %, and in further embodiments from about 10 to about 20 wt. % of the composition.

Hydroxy Functional Components

Many of the known radiation curable composition compositions for additive fabrication use hydroxy-functional compounds to enhance the properties of the parts made from the compositions.

In certain embodiments of the invention, the composition may optionally contain a hydroxy-functional component. The hydroxyl-containing material which can be used in the present invention may be any suitable organic material having a hydroxyl functionality of at least 1. If present, the material is preferably substantially free of any groups which interfere with the curing reactions or which are thermally or photolytically unstable.

If present, any hydroxy group may be employed for the particular purpose. If present, the hydroxyl-containing material preferably contains one or more primary or secondary aliphatic hydroxyl. The hydroxyl group may be internal in the molecule or terminal. Monomers, oligomers or polymers can be used. The hydroxyl equivalent weight, i.e., the number average molecular weight divided by the number of hydroxyl groups, is preferably in the range of 31 to 5000.

Representative examples of hydroxyl-containing materials having a hydroxyl functionality of 1 include alkanols, monoalkyl ethers of polyoxyalkyleneglycols, mohoalkyl ethers of alkyleneglycols, and others, and combinations thereof.

Representative examples of monomeric polyhydroxy organic materials include alkylene and arylalkylene glycols and polyols, such as 1,2,4-butanetriol, 1,2,6-hexanetriol, 1,2,3-heptanetriol, 2,6-dimethyl-1,2,6-hexanetriol, (2R,3R)-(−)-2-benzyloxy-1,3,4-butanetriol, 1,2,3-hexanetriol, 1,2,3-butanetriol, 3-methyl-1,3,5-pentanetriol, 1,2,3-cyclohexanetriol, 1,3,5-cyclohexanetriol, 3,7,11,15-tetramethyl-1,2,3-hexadecanetriol, 2-hydroxymethyltetrahydropyran-3,4,5-triol, 2,2,4,4-tetramethyl-1,3-cyclobutanediol, 1,3-cyclopentanediol, trans-1,2-cyclooctanediol, 1,16-hexadecanediol, 3,6-dithia-1,8-octanediol, 2-butyne-1,4-diol, 1,3-propanediol, 1,4-butanediol, 1,5-pentanediol, 1,6-hexanediol, 1,7-heptanediol, 1,8-octanediol, 1,9-nonanediol, 1-phenyl-1,2-ethanediol, 1,2-cyclohexanediol, 1,5-decalindiol, 2,5-dimethyl-3-hexyne-2,5-diol, 2,7-dimethyl-3,5-octadiyne-2-7-diol, 2,3-butanediol, 1,4-cyclohexanedimethanol, and combinations thereof.

Representative examples of oligomeric and polymeric hydroxyl-containing materials include polyoxyethylene and polyoxypropylene glycols and triols of molecular weights from about 200 to about 10,000; polytetramethylene glycols of varying molecular weight; poly(oxyethylene-oxybutylene) random or block copolymers; copolymers containing pendant hydroxy groups formed by hydrolysis or partial hydrolysis of vinyl acetate copolymers, polyvinylacetal resins containing pendant hydroxyl groups; hydroxy-terminated polyesters and hydroxy-terminated polylactones; hydroxy-functionalized polyalkadienes, such as polybutadiene; aliphatic polycarbonate polyols, such as an aliphatic polycarbonate diol; and hydroxy-terminated polyethers, and combinations thereof.

If present, preferred hydroxyl-containing monomers include 1,4-cyclohexanedimethanol and aliphatic and cycloaliphatic monohydroxy alkanols. Such preferred hydroxyl-containing oligomers and polymers include hydroxyl and hydroxyl/epoxy functionalized polybutadiene, polycaprolactone diols and triols, ethylene/butylene polyols, and monohydroxyl functional monomers. Preferred examples of polyether polyols are polypropylene glycols of various molecular weights and glycerol propoxylate-B-ethoxylate triol. If present, especially preferred are linear and branched polytetrahydrofuran polyether polyols available in various molecular weights, such as in the range of 150-4000 g/mol, preferably in the range of 150-1500 g/mol, more preferably in the range of 150-750 g/mol.

If present, the composition preferably comprises, relative to the total weight of the composition, at most 10 wt. % of one or more non-free radical polymerizable hydroxy-functional compounds, more preferably at most 5 wt. %, and most preferably at most 2 wt. %.

In preferred embodiments, the radiation curable composition for additive fabrication of the present invention includes a photoinitiating system. The photoinitiating system can include a free-radical photoinitiator and/or a cationic photoinitiator. In accordance with an embodiment, the radiation curable composition includes a photoinitiating system contains at least one photoinitiator having a cationic initiating function, and at least one photoinitiator having a free radical initiating function. Additionally, the photoinitiating system can include a photoinitiator that contains both free-radical initiating function and cationic initiating function on the same molecule. The photoinitiator is a compound that chemically changes due to the action of light or the synergy between the action of light and the electronic excitation of a sensitizing dye to produce at least one of a radical, an acid, and a base.

Cationic Photoinitiator

In accordance with an embodiment, the radiation curable composition includes a cationic photoinitiator. The cationic photoinitiator initiates cationic ring-opening polymerization upon irradiation of light.

In an embodiment, any suitable cationic photoinitiator can be used, for example, those with cations selected from the group consisting of onium salts, halonium salts, iodosyl salts, selenium salts, sulfonium salts, sulfoxonium salts, diazonium salts, metallocene salts, isoquinolinium salts, phosphonium salts, arsonium salts, tropylium salts, dialkylphenacylsulfonium salts, thiopyrilium salts, diaryl iodonium salts, triaryl sulfonium salts, ferrocenes, di(cyclopentadienyliron)arene salt compounds, and pyridinium salts, and any combination thereof.

In another embodiment, the cation of the cationic photoinitiator is selected from the group consisting of aromatic diazonium salts, aromatic sulfonium salts, aromatic iodonium salts, metallocene based compounds, aromatic phosphonium salts, and any combination thereof. In another embodiment, the cation is a polymeric sulfonium salt, such as in U.S. Pat. Nos. 5,380,923 or 5,047,568, or other aromatic heteroatom-containing cations and naphthyl-sulfonium salts such as in U.S. Pat. Nos. 7,611,817, 7,230,122, US2011/0039205, US2009/0182172, U.S. Pat. No. 7,678,528, EP2308865, WO2010046240, or EP2218715. In another embodiment, the cationic photoinitiator is selected from the group consisting of triaryl sulfonium salts, diaryliodonium salts, and metallocene based compounds, and any combination thereof. Onium salts, e.g., iodonium salts and sulfonium salts, and ferrocenium salts, have the advantage that they are generally more thermally stable.

In a particular embodiment, the cationic photoinitiator has an anion selected from the group consisting of $BF_4^-$, $AsF_6^-$, $SbF_6^-$, $PF_6^-$, $[B(CF_3)_4]^-$, $B(C_6F_5)_4^-$, $B[C_6H_3\text{-}3,5(CF_3)_2]_4^-$, $B(C_6H_4CF_3)_4^-$, $B(C_6H_3F_2)_4^-$, $B[C_6F_4\text{-}4(CF_3)]_4^-$, $Ga(C_6F_5)_4^-$, $[(C_6F_5)_3B\text{—}C_3H_3N_2\text{—}B(C_6F_5)_3]^-$, $[(C_6F_5)_3B\text{—}NH_2\text{—}B(C_6F_5)_3]^-$, tetrakis(3,5-difluoro-4-alkyloxyphenyl)borate, tetrakis(2,3,5,6-tetrafluoro-4-alkyloxyphenyl)borate, perfluoroalkylsulfonates, tris[(perfluoroalkyl)sulfonyl]methides, bis[(perfluoroalkyl)sulfonyl]imides, perfluoroalkylphosphates, tris(perfluoroalkyl)trifluorophosphates, bis(perfluoroalkyl)tetrafluorophosphates, tris(pentafluoroethyl)trifluorophosphates, and $(CH_6B_{11}Br_6)^-$, $(CH_6B_{11}Cl_6)^-$ and other halogenated carborane anions.

A survey of other onium salt initiators and/or metallocene salts can be found in "UV Curing, Science and Technology", (Editor S. P. Pappas, Technology Marketing Corp., 642 Westover Road, Stamford, Conn., U.S.A.) or "Chemistry & Technology of UV & EB Formulation for Coatings, Inks & Paints", Vol. 3 (edited by P. K. T. Oldring).

In an embodiment, the cationic photoinitiator has a cation selected from the group consisting of aromatic sulfonium salts, aromatic iodonium salts, and metallocene based compounds with at least an anion selected from the group consisting of $SbF_6^-$, $PF_6^-$, $B(C_6F_5)_4^-$, $[B(CF_3)_4]^-$, tetrakis(3,5-difluoro-4-methoxyphenyl)borate, perfluoroalkylsulfonates, perfluoroalkylphosphates, tris[(perfluoroalkyl)sulfonyl]methides, and $[(C_2F_5)_3PF_3]^-$.

Examples of cationic photoinitiators useful for curing at 300-475 nm, particularly at 365 nm UV light, without a sensitizer include 4-[4-(3-chlorobenzoyl)phenylthio]phenylbis(4-fluorophenyl)sulfonium hexafluoroantimonate, 4-[4-(3-chlorobenzoyl)phenylthio]phenylbis(4-fluorophenyl)sulfonium tetrakis(pentafluorophenyl)borate, 4-[4-(3-chlorobenzoyl)phenylthio]phenylbis(4-fluorophenyl)sulfonium tetrakis(3,5-difluoro-4-methyloxyphenyl)borate, 4-[4-(3-chlorobenzoyl)phenylthio]phenylbis(4-fluorophenyl) sulfonium tetrakis(2,3,5,6-tetrafluoro-4-methyloxyphenyl)borate, tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), tris(4-(4-acetylphenyl)thiophenyl)sulfonium hexafluorophosphate (Irgacure® 270 from BASF), and HS-1 available from San-Apro Ltd.

Preferred cationic photoinitiators include, either alone or in a mixture: bis[4-diphenylsulfoniumphenyl]sulfide bishexafluoroantimonate; thiophenoxyphenylsulfonium hexafluoroantimonate (available as Chivacure 1176 from Chitec), tris(4-(4-acetylphenyl)thiophenyl)sulfonium tetrakis(pentafluorophenyl)borate (Irgacure® PAG 290 from BASF), tris(4-(4-acetylphenyl)thiophenyl)sulfonium tris[(trifluoromethyl)sulfonyl]methide (Irgacure® GSID 26-1 from BASF), and tris(4-(4-acetylphenyl)thiophenyl)sulfonium hexafluorophosphate (Irgacure® 270 from BASF), [4-(1-methylethyl)phenyl](4-methylphenyl) iodonium tetrakis(pentafluorophenyl)borate (available as Rhodorsil 2074 from Rhodia), 4-[4-(2-chlorobenzoyl)phenylthio]phenylbis(4-fluorophenyl)sulfonium hexafluoroantimonate (as SP-172 from Adeka), SP-300 from Adeka, and aromatic sulfonium salts with anions of $(PF_{6-m}(C_nF_{2n+1})_m)^-$ where m is an integer from 1 to 5, and n is an integer from 1 to 4 (available as CPI-200K or CPI-200S, which are monovalent sulfonium salts from San-Apro Ltd., TK-1 available from San-Apro Ltd., or HS-1 available from San-Apro Ltd.).

In various embodiments, the radiation curable composition for additive fabrication may be irradiated by laser or LED light operating at any wavelength in either the UV or visible light spectrum. In particular embodiments, the irradiation is from a laser or LED emitting a wavelength of from 340 nm to 415 nm. In particular embodiments, the laser or LED source emits a peak wavelength of about 340 nm, 355 nm, 365 nm, 375 nm, 385 nm, 395 nm, 405 nm, or 415 nm.

In an embodiment of the invention, the radiation curable composition for additive fabrication comprises an aromatic triaryl sulfonium salt cationic photoinitiator.

Use of aromatic triaryl sulfonium salts in additive fabrication applications is known. Please see US 20120251841 to DSM IP Assets, B.V. (which is hereby incorporated in its entirety), U.S. Pat. No. 6,368,769, to Asahi Denki Kogyo, which discusses aromatic triaryl sulfonium salts with tetraryl borate anions, including tetrakis(pentafluorophenyl)borate, and use of the compounds in stereolithography applications. Triarylsulfonium salts are disclosed in, for example, J Photopolymer Science & Tech (2000), 13(1), 117-118 and J Poly Science, Part A (2008), 46(11), 3820-29. Triarylsulfonium salts $Ar_3S^+MXn^-$ with complex metal halide anions such as $BF_4^-$, $AsF_6^-$, $PF_6^-$, and $SbF_6^-$, are disclosed in J Polymer Sci, Part A (1996), 34(16), 3231-3253.

The use of aromatic triaryl sulfonium salts as the cationic photoinitiator in radiation curable compositions is desirable in additive fabrication processes because the resulting resin attains a fast photospeed, good thermal-stability, and good photo-stability.

In an embodiment, the cationic photoinitiator is an aromatic triaryl sulfonium salt that is more specifically an R-substituted aromatic thioether triaryl sulfonium tetrakis (pentafluorophenyl)borate cationic photoinitiator, having a tetrakis(pentafluorophenyl)borate anion and a cation of the following formula (I):

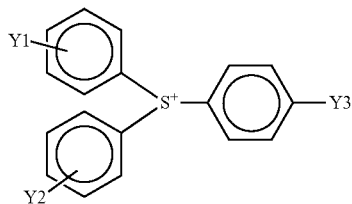

I wherein Y1, Y2, and Y3 are the same or different and wherein Y1, Y2, or Y3 are R-substituted aromatic thioether with R being an acetyl or halogen group.

In an embodiment, Y1, Y2, and Y3 are the same. In another embodiment, Y1 and Y2 are the same, but Y3 is different. In another embodiment, Y1, Y2, or Y3 are an R-substituted aromatic thioether with R being an acetyl or halogen group. Preferably Y1, Y2, or Y3 are a para-R-substituted aromatic thioether with R being an acetyl or halogen group.

A particularly preferred R-substituted aromatic thioether triaryl sulfonium tetrakis(pentafluorophenyl)borate cationic photoinitiator is tris(4-(4-acetylphenyl)thiophenyl)sulfonium tetrakis(pentafluorophenyl)borate. Tris(4-(4-acetylphenyl)thiophenyl)sulfonium tetrakis(pentafluorophenyl)borate is known commercially as IRGACURE® PAG-290 (formerly known by the development code GSID4480-1) and is available from Ciba/BASF.

An R-substituted aromatic thioether triaryl sulfonium tetrakis(pentafluorophenyl)borate cationic photoinitiator, for instance, tris(4-(4-acetylphenyl)thiophenyl)sulfonium tetrakis(pentafluorophenyl)borate, is also more thermally-stable than some other cationic photoinitiators. The improved thermal-stability allows radiation curable compositions for additive fabrication incorporating a triaryl sulfonium tetrakis(pentafluorophenyl)borate cationic photoinitiator instead of other conventional cationic photoinitiators to retain their viscosity at elevated temperatures for long periods of time.

In another embodiment, the cationic photoinitiator is an aromatic triaryl sulfonium salt that possesses an anion represented by $SbF_6^-$, $PF_6^-$, $BF_4^-$, $(CF_3CF_2)_3PF_3^-$, $(C_6F_5)_4B^-$, $((CF_3)_2C_6H_3)_4B^-$, $(C_6F_5)_4Ga^-$, $((CF_3)_2C_6H_3)_4Ga^-$, trifluoromethanesulfonate, nonafluorobutanesulfonate, methanesulfonate, butanesulfonate, benzenesulfonate, or p-toluenesulfonate, and a cation of the following formula (II):

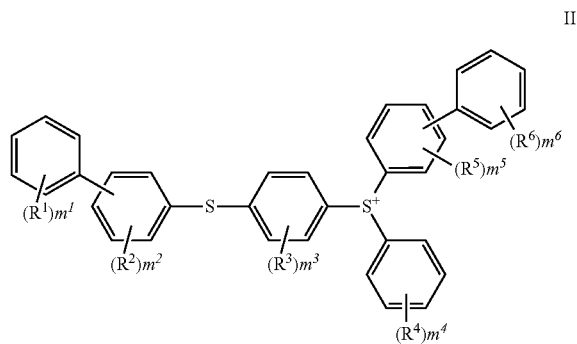

II wherein in formula (II), $R^2$, $R^3$, $R^5$ and $R^6$ each independently represent an alkyl group, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, $R^4$ represents an alkyl group, a hydroxy group, an alkoxy group, an alkylcarbonyl group, an alkoxycarbonyl group, an acyloxy group, an alkylthio group, a heterocyclic hydrocarbon group, an alkylsulfinyl group, an alkylsulfonyl group, a hydroxy(poly)alkyleneoxy group, an optionally substituted amino group, a cyano group, a nitro group, or a halogen atom, $m^1$ to $m^6$ each represent the number of occurrences of each of $R^1$ to $R^6$, $m^1$, $m^4$, and $m^6$ each represent an integer of 0 to 5, $m^2$, $m^3$, and $m^5$ each represent an integer of 0 to 4. Such photoinitiators are described in, for example, U.S. Pat. No. 8,617,787.

A particularly preferred aromatic triaryl sulfonium cationic photoinitiator has an anion that is a fluoroalkyl-substituted fluorophosphate. Commercial examples of an aromatic triaryl sulfonium cationic photoinitiator having a fluoroalkyl-substituted fluorophosphate anion is the CPI-200 series (for example CPI-200K® or CPI-210S®) or 300 series, available from San-Apro Limited.

In accordance with some embodiments of the invention, the radiation curable composition for additive fabrication includes a cationic polymerizable component in addition to an R-substituted aromatic thioether triaryl sulfonium tetrakis (pentafluorophenyl)borate or fluoroalkyl-substituted fluorophosphate cationic photoinitiator. In other embodiments, the radiation curable compositions for additive fabrication include cationic polymerizable components, free-radical photoinitiators, and free-radical polymerizable components. In some embodiments, the radiation curable compositions for additive fabrication include an R-substituted aromatic thioether triaryl sulfonium tetrakis(pentafluorophenyl)borate cationic photoinitiator and additional cationic photoinitiators and/or photosensitizers, along with a cationic polymerizable component and, optionally, free-radical polymerizable components and free-radical photoinitiators.

The radiation curable composition can include any suitable amount of the cationic photoinitiator, for example, in certain embodiments, in an amount up to about 15% by weight of the composition, in certain embodiments, up to about 5% by weight of the composition, and in further embodiments from about 2% to about 10% by weight of the composition, and in other embodiments, from about 0.1% to about 5% by weight of the composition. In a further embodiment, the amount of cationic photoinitiator is from about 0.2 wt. % to about 4 wt. % of the total composition, and in other embodiments from about 0.5 wt. % to about 3 wt. %.

In some embodiments, depending on the wavelength of light used for curing the radiation curable composition, it is desirable for the radiation curable composition to include a photosensitizer. The term "photosensitizer" is used to refer to any substance that either increases the rate of photoinitiated polymerization or shifts the wavelength at which polymerization occurs; see textbook by G. Odian, Principles of Polymerization, $3^{rd}$ Ed., 1991, page 222. A variety of compounds can be used as photosensitizers, including heterocyclic and fused-ring aromatic hydrocarbons, organic dyes, and aromatic ketones. Examples of photosensitizers include those selected from the group consisting of methanones, xanthenones, pyrenemethanols, anthracenes, pyrene, perylene, quinones, xanthones, thioxanthones, benzoyl esters, benzophenones, and any combination thereof. Particular examples of photosensitizers include those selected from the group consisting of [4-[(4-methylphenyl)thio]phenyl]phenyl-methanone, isopropyl-9H-thioxanthen-9-one, 1-pyrenemethanol, 9-(hydroxymethyl)anthracene, 9,10-diethoxyanthracene, 9,10-dimethoxyanthracene, 9,10-dipropoxyanthracene, 9,10-dibutyloxyanthracene, 9-anthracenemethanol acetate, 2-ethyl-9,10-dimethoxyanthracene, 2-methyl-9,10-dimethoxyanthracene, 2-t-butyl-9,10-dimethoxyanthracene, 2-ethyl-9,10-diethoxyanthracene and 2-methyl-9,10-diethoxyanthracene, anthracene, anthraquinones, 2-methylanthraquinone, 2-ethylanthraquinone, 2-tertbutylanthraquinone, 1-chloroanthraquinone, 2-amylanthraquinone, thioxanthones and xanthones, isopropyl thioxanthone, 2-chlorothioxanthone, 2,4-diethylthioxanthone, 1-chloro-4-propoxythioxanthone, methyl benzoyl formate (Darocur MBF from BASF), methyl-2-benzoyl benzoate (Chivacure OMB from Chitec), 4-benzoyl-4'-methyl diphenyl sulphide (Chivacure BMS from Chitec), 4,4'-bis(diethylamino) benzophenone (Chivacure EMK from Chitec), and any combination thereof.

The novel mixtures may also contain various photoinitiators of different sensitivity to radiation of emission lines with different wavelengths to obtain a better utilization of a UV light source. The use of known photoinitiators of different sensitivity to radiation of emission lines is well known in the art of additive fabrication and may be selected in accordance with radiation sources of, for example, 351, nm 355 nm, 365 nm, 385 nm, and 405 nm. In this context it is advantageous for the various photoinitiators to be selected such, and employed in a concentration such, that equal optical absorption is produced with the emission lines used.

The radiation curable composition for additive fabrication can include any suitable amount of the photosensitizer, for example, in certain embodiments, in an amount up to about 10% by weight of the composition, in certain embodiments, up to about 5% by weight of the composition, and in further embodiments from about 0.05% to about 2% by weight of the composition.

Free-Radical Photoinitiator

Typically, free radical photoinitiators are divided into those that form radicals by cleavage, known as "Norrish Type I" and those that form radicals by hydrogen abstraction, known as "Norrish type II". The Norrish type II photoinitiators require a hydrogen donor, which serves as the free radical source. As the initiation is based on a bimolecular reaction, the Norrish type II photoinitiators are generally slower than Norrish type I photoinitiators which are based on the unimolecular formation of radicals. On the other hand, Norrish type II photoinitiators possess better optical absorption properties in the near-UV spectroscopic region. Photolysis of aromatic ketones, such as benzophenone, thioxanthones, benzil, and quinones, in the presence of hydrogen donors, such as alcohols, amines, or thiols leads to the formation of a radical produced from the carbonyl compound (ketyl-type radical) and another radical derived from the hydrogen donor. The photopolymerization of vinyl monomers is usually initiated by the radicals produced from the hydrogen donor. The ketyl radicals are usually not reactive toward vinyl monomers because of the steric hindrance and the delocalization of an unpaired electron.

To successfully formulate a radiation curable composition for additive fabrication, it is necessary to review the wavelength sensitivity of the photoinitiator(s) present in the composition to determine if they will be activated by the radiation source chosen to provide the curing light.

In accordance with an embodiment, the radiation curable composition for additive fabrication includes at least one free radical photoinitiator, e.g., those selected from the group consisting of benzoylphosphine oxides, aryl ketones, benzophenones, hydroxylated ketones, 1-hydroxyphenyl ketones, ketals, metallocenes, and any combination thereof.

In an embodiment, the radiation curable composition for additive fabrication includes at least one free-radical photoinitiator selected from the group consisting of 2,4,6-trimethylbenzoyl diphenylphosphine oxide and 2,4,6-trimethylbenzoyl phenyl, ethoxy phosphine oxide, bis(2,4,6-trimethylbenzoyl)-phenylphosphineoxide, 2-methyl-1-[4-(methylthio)phenyl]-2-morpholinopropanone-1,2-benzyl-2-(dimethylamino)-1-[4-(4-morpholinyl) phenyl]-1-butanone, 2-dimethylamino-2-(4-methyl-benzyl)-1-(4-morpholin-4-yl-phenyl)-butan-1-one, 4-benzoyl-4'-methyl diphenyl sulphide, 4,4'-bis(diethylamino) benzophenone, and 4,4'-bis(N, N'-dimethylamino) benzophenone (Michler's ketone), benzophenone, 4-methyl benzophenone, 2,4,6-trimethyl benzophenone, dimethoxybenzophenone, 1-hydroxycyclohexyl phenyl ketone, phenyl (1-hydroxyisopropyl)ketone, 2-hydroxy-1-[4-(2-hydroxyethoxy) phenyl]-2-methyl-1-propanone, 4-isopropylphenyl(1-hydroxyisopropyl)ketone, oligo-[2-hydroxy-2-methyl-1-[4-(1-methylvinyl)phenyl] propanone], camphorquinone, 4,4'-bis(diethylamino) benzophenone, benzil dimethyl ketal, bis(eta 5-2-4-cyclopentadien-1-yl) bis[2,6-difluoro-3-(1H-pyrrol-1-yl) phenyl] titanium, and any combination thereof.

For light sources emitting in the 300-475 nm wavelength range, especially those emitting at 365 nm, 390 nm, or 395 nm, examples of suitable free-radical photoinitiators absorbing in this area include: benzoylphosphine oxides, such as, for example, 2,4,6-trimethylbenzoyl diphenylphosphine oxide (Lucirin TPO from BASF) and 2,4,6-trimethylbenzoyl phenyl, ethoxy phosphine oxide (Lucirin TPO-L from BASF), bis(2,4,6-trimethylbenzoyl)-phenylphosphineoxide (Irgacure 819 or BAPO from Ciba), 2-methyl-1-[4-(methylthio)phenyl]-2-morpholinopropanone-1 (Irgacure 907 from Ciba), 2-benzyl-2-(dimethylamino)-1-[4-(4-morpholinyl) phenyl]-1-butanone (Irgacure 369 from Ciba), 2-dimethylamino-2-(4-methyl-benzyl)-1-(4-morpholin-4-yl-phenyl)-butan-1-one (Irgacure 379 from Ciba), 4-benzoyl-4'-methyl diphenyl sulphide (Chivacure BMS from Chitec), 4,4'-bis(diethylamino) benzophenone (Chivacure EMK from Chitec), and 4,4'-bis(N,N'-dimethylamino) benzophenone (Michler's ketone). Also suitable are mixtures thereof.

Additionally, photosensitizers are useful in conjunction with photoinitiators in effecting cure with LED light sources emitting in this wavelength range. Examples of suitable photosensitizers include: anthraquinones, such as 2-methylanthraquinone, 2-ethylanthraquinone, 2-tertbutylanthraquinone, 1-chloroanthraquinone, and 2-amylanthraquinone, thioxanthones and xanthones, such as isopropyl thioxanthone, 2-chlorothioxanthone, 2,4-diethylthioxanthone, and 1-chloro-4-propoxythioxanthone, methyl benzoyl formate (Darocur MBF from Ciba), methyl-2-benzoyl benzoate (Chivacure OMB from Chitec), 4-benzoyl-4'-methyl diphenyl sulphide (Chivacure BMS from Chitec), 4,4'-bis(diethylamino) benzophenone (Chivacure EMK from Chitec).

It is possible for UV radiation sources to be designed to emit light at shorter wavelengths. For light sources emitting at wavelengths from between about 100 and about 300 nm, it is possible to employ a photosensitizer with a photoinitiator. When photosensitizers, such as those previously listed are present in the formulation, other photoinitiators absorbing at shorter wavelengths can be used. Examples of such photoinitiators include: benzophenones, such as benzophenone, 4-methyl benzophenone, 2,4,6-trimethyl benzophenone, dimethoxybenzophenone, and 1-hydroxyphenyl ketones, such as 1-hydroxycyclohexyl phenyl ketone, phenyl (1-hydroxyisopropyl)ketone, 2-hydroxy-1-[4-(2-hroxyethoxy) phenyl]-2-methyl-1-propanone, and 4-isopropylphenyl(1-hydroxyisopropyl)ketone, benzil dimethyl ketal, and oligo-[2-hydroxy-2-methyl-1-[4-(1-methylvinyl)phenyl]propanone] (Esacure KIP 150 from Lamberti).

Radiation sources can also be designed to emit at higher wavelengths. For radiation sources emitting light at wavelengths from about 475 nm to about 900 nm, examples of suitable free radical photoinitiators include: camphorquinone, 4,4'-bis(diethylamino) benzophenone (Chivacure EMK from Chitec), 4,4'-bis(N,N'-dimethylamino) benzophenone (Michler's ketone), bis(2,4,6-trimethylbenzoyl)-phenylphosphineoxide ("BAPO," or Irgacure 819 from Ciba), metallocenes such as bis (eta 5-2-4-cyclopentadien-1-yl) bis [2,6-difluoro-3-(1H-pyrrol-1-yl) phenyl] titanium (Irgacure 784 from Ciba), and the visible light photoinitiators from Spectra Group Limited, Inc. such as H-Nu 470, H-Nu-535, H-Nu-635, H-Nu-Blue-640, and H-Nu-Blue-660.

In one embodiment of the instant claimed invention, the light emitted by the radiation source is UVA radiation, which is radiation with a wavelength between about 320 and about 400 nm. In one embodiment of the instant claimed invention, the light emitted by the radiation source is UVB radiation, which is radiation with a wavelength between about 280 and about 320 nm. In one embodiment of the instant claimed invention, the light emitted by the radiation source is UVC radiation, which is radiation with a wavelength between about 100 and about 280 nm.

The radiation curable composition for additive fabrication can include any suitable amount of the free-radical photoinitiator as component (d), for example, in certain embodiments, in an amount up to about 10 wt. % of the composition, in certain embodiments, from about 0.1 to about 10 wt. % of the composition, and in further embodiments from about 1 to about 6 wt. % of the composition.

Fillers

The liquid radiation curable composition for additive fabrication according to the present invention also preferably comprises at least one filler. Inorganic substances are especially preferred as fillers because of their tendency to impart water-resistance, heat-resistance, and robust mechanical properties into the cured, solid three-dimensional parts made therefrom. In an embodiment, the radiation curable composition for additive fabrication according to the present invention consists, or consists essentially of, inorganic fillers.

In an embodiment, a filler of which the particles are spherical—herein defined as having a sphericity of 0.80 or greater—is used, because of their ability to maintain lower composition viscosities, along with the improved molding properties and enhanced accuracy they impart into three dimensional objects made of the prepared composition of the present invention.

In an embodiment of the invention, the filler is inorganic and comprises, consists of, or consists essentially of ceramics such as silica ($SiO_2$) nanoparticles, i.e., those particles having a mean particle size of from between 1 nanometer (nm) to 999 nm, or between 5 nm to 999 nm, or between 10 nm to 999 nm. In an embodiment, the filler is inorganic and comprises, consists of, or consists essentially of or silica microparticles, i.e., those particles having a mean particle size of between 1 micrometer ($\mu m$) to 999 $\mu m$, or between 1 $\mu m$ to 800 $\mu m$, or between 1 $\mu m$ to 500 $\mu m$, or between 1 $\mu m$ to 100 $\mu m$. In a preferred embodiment, the filler consists of inorganic microparticles and/or nanoparticles, such as silica microparticles and/or silica nanoparticles. Average particle size may be measured using laser diffraction particle size analysis in accordance with ISO13320:2009. A person skilled in the art to which this invention applies will appreciate the specific equipment and conditions required for measuring particles per such standard which are below 0.1 $\mu m$. A suitable device for measuring the average particle diameter of nanoparticles is the LB-550 machine, available from Horiba Instruments, Inc, which measures particle diameter by dynamic light scattering.

The nanoparticles or microparticles may be substantially silica-based powders, for instance, greater than 85 wt. %, more preferably 90 wt. %, more preferably 95 wt. % of silica ($SiO_2$). Certain non-limiting examples of commercially available silica powder products include Crystallite 3K-S, Crystallite NX-7, Crystallite MCC-4, Crystallite CMC-12, Crystallite A-1, Crystallite AA, Crystallite C, Crystallite D, Crystallite CMC-1, Crystallite C-66, Crystallite 5X, Crystallite 2A-2, Crystallite VX-S2, Crystallite VX-SR, Crystallite VX-X, Crystallite VX-S, HUSELEX RD-8, HUSELEX RD-120, HUSELEX MCF-4, HUSELEX GP-200T, HUSELEX ZA-30, HUSELEX RD-8, HUSELEX Y-40, HUSELEX E-2, HUSELEX Y-60, HUSELEX E-1, HUSELEX E-2, HUSELEX FF, HUSELEX X, HUSELEX ZA-20, IMSIL A-25, IMSIL A-15, IMSIL A-10, and IMSIL A-8, (Ryushin Co., Ltd.); ORGANOSILICASOL™ MEK-EC-2102, ORGANOSILICASOL™ MEK-EC-2104, ORGANOSILICASOL™ MEK-AC-2202, ORGANOSILICASOL™ MEK-AC-4101, ORGANOSILICASOL™ MEK-AC-5101, ORGANOSILICASOL™ MIBK-SD, ORGANOSILICASOL™ MIBK-SD-L, ORGANOSILICASOL™ DMAC-ST, ORGANOSILICASOL™ EG-ST, ORGANOSILICASOL™ IPA-ST, ORGANOSILICASOL™ IPA-ST-L, ORGANOSILICASOL™ IPA-ST-L-UP, ORGANOSILICASOL™ IPA-ST-ZL, ORGANOSILICASOL™ MA-ST-M, ORGANOSILICASOL™ MEK-ST, ORGANOSILICASOL™ MEK-ST-L, ORGANOSILICASOL™ MEK-ST-UP, ORGANOSILICASOL™ MIBK-ST, ORGANOSILICASOL™ MT-ST, ORGANOSILICASOL™ NPC-ST-30, ORGANOSILICASOL™ PMA-ST, SUNSPHERE H-31, SUNSPHERE H-32, SUNSPHERE H-51, SUNSPHERE H-52, SUNSPHERE H-121, SUNSPHERE H-122, SUNSPHERE L-31, SUNSPHERE L-51, SUNSPHERE L-121, SUNSPHERE NP-30, SUNSPHERE NP-100, and SUNSPHERE NP-200 (Asahi Glass Co., Ltd.); Silstar MK-08 and MK-15 (Nippon Chemical Industrial Co., Ltd.); FB-48 (Denki Kagaku Kogyo K.K.); Nipsil SS-10, Nipsil SS-15, Nipsil SS-10A, Nipsil SS-20, Nipsil SS-30P, Nipsil SS-30S, Nipsil SS-40, Nipsil SS-50, Nipsil SS-50A, Nipsil SS-70, Nipsil SS-100, Nipsil SS-10F, Nipsil SS-50F, Nipsil SS-50B, Nipsil SS-50C, Nipsil SS-72F, Nipsil SS-170X, Nipsil SS-178B, Nipsil E150K, Nipsil E-150J, Nipsil E-1030, Nipsil ST-4, Nipsil E-170, Nipsil E-200, Nipsil E-220, Nipsil E-200A, Nipsil E-1009, Nipsil E-220A, Nipsil E-1011, NipsilE-K300, Nipsil HD, Nipsil HD-2, Nipsil N-300A, Nipsil L-250, Nipsil G-300, Nipsil E-75, Nipsil E-743, and Nipsil E-74P (Nippon Silica Industry, Ltd.). Please see U.S. Pat. No. 6,013,714 for further examples of silica particles.

In other embodiments of the invention, alternative inorganic filler substances may be used, such as those containing glass or metal particles. Certain non-limiting examples of such substances include: glass powder, alumina, alumina hydrate, magnesium oxide, magnesium hydroxide, barium sulfate, calcium sulfate, calcium carbonate, magnesium carbonate, silicate mineral, diatomaceous earth, silica sand, silica powder, oxidation titanium, aluminum powder, bronze, zinc powder, copper powder, lead powder, gold powder, silver dust, glass fiber, titanic acid potassium whiskers, carbon whiskers, sapphire whiskers, verification rear whiskers, boron carbide whiskers, silicon carbide whiskers, and silicon nitride whiskers.

Certain non-limiting examples of such other commercially available inorganic filler products include Glass bead GB210, GB210A, GB210B, GB210C, GB045Z, GB045ZA, GB045ZB, GB045ZC, GB731, GB731A, GB731B, GB731C, GB731M, GB301S, EGB210, EGB210A, EGB210B, EGB210C, EGB045Z, EGB045ZA, EGB045ZB, EGB045ZC, MB-10, MB-20, EMB-10, EMB-20, HSC070Q, HSC-024X, HSC-0805, HSC-070G, HSC-075L, HSC-110, HSC-110A, HSC-110B, and HSC-110C (Toshiba Balotini Co., Ltd.); Radiolite #100, Radiolite Fine Flow B, Radiolite Fine Flow A, Radiolite Sparkle Flow, Radiolite Special Flow, Radiolite #300, Radiolite #200, Radiolite Clear Flow, Radiolite #500, Radiolite #600, Radiolite #2000, Radiolite #700, Radiolite #500S, Radiolite #800, Radiolite #900, Radiolite #800S, Radiolite #3000, Radiolite Ace, Radiolite Superace, Radiolite High Ace, Radiolite PC-1, Radiolite Delux P-5, Radiolite Delux W50, Radiolite Microfine, Radiolite F, Radiolite SPF, Radiolite GC, Topco #31, Topco #34, Topco #36, Topco #38, and Topco #54 (Showa Chemical Industry Co., Ltd.); Higilite H-X, Higilite H-21, Higilite H-31, Higilite H-32, Higilite H-42, Higilite H-42M, Higilite H-43, Higilite H-32ST, Higilite H-42STV, Higilite H-42T, Higilite H-34, Higilite H-34HL, Higilite H-32I, Higilite H-42I, Higilite H-425, Higilite H-210, Higilite H-310, Higilite H-320, Higilite H-141, Higilite H-241, Higilite H-341, Higilite H-3201, Higilite H-320ST, Higilite HS-310, Higilite HS-320, Higilite HS-341, Alumina A-426, alumina A-42-1, Alumina A-42-2, Alumina A-42-3, Alumina A-420, Alumina A-43M, Alumina A-43-L, Alumina A-50-K, Alumina A-50-N, Alumina A-50-F, Alumina AL-45-H, Alumina AL-45-2, Alumina AL-45-1, Alumina AL-43-M, Alumina AL-43-L, Alumina AL-43PC, Alumina AL-150SG, Alumina AL-170, Alumina A-172, Alumina A-173, Alumina AS10, Alumina AS-20, Alumina AS-30, Alumina AS-40, and Alumina AS-50 (Showa Denko K.K.); Starmague U, Starmague M, Starmague L, Starmague P, Starmague C, Starmague CX, High purity magnesia HP-10, High purity magnesia HP-10N, High purity magnesia HP-30, Star brand-200, Star brand-10, Star brand-10A, Star brand magnesium carbonate Venus, Star brand magnesium carbonate two stars, Star brand magnesium carbonate one star, Star brand magnesium carbonate S, Star brand magnesium carbonate Fodder, Star brand heavy magnesium carbonate, High purity magnesium carbonate GP-10, High purity magnesium carbonate 30, Star brand light calcium carbonate general use, Star brand light calcium carbonates EC, and Star brand light calcium carbonate KFW-200 (Konoshima Chemical Industry Co., Ltd.); MKC Silica GS50Z and MKC Silica SS-15 (Mitsubishi Chemical Corp.), Admafine SOE-E3, Admafine SO-C3, Admafine AO-800, Admafine AO-809, Admafine AO-500, and Admafine AO-509 (Adomatex Co., Ltd.); M. S. GEL D-560A, M. S. GEL D-5120A, M. S. GEL D-5300A, M. S. GEL D-2060A, M. S. GEL D-20120A, M. S. GEL D-20-300A, SILDE-X H-31, SELDEX H-32, SILDEX H-51, SILDEX H-52, SILDEX H-121, SILDEX H-122, SILDEX L-31, SILDEX L-51, SILDEX L-121, SILD EX F-51, and SILDEX F-121 (Asahi Glass); SYLYSIA 250, SYLYSIA 250N, SYLYSIA 256, SYLYSIA 256N, SYLYSIEA 310, SYLYSIA 320, SYLYSIA 350, SYLYSIA 358, SYLYSIA 430, SYLYSIA 431, SYLYSIA 440, SYLYSIA 450, SYLYSIA 470, SYLYSIA 435, SYLYSIA 445, SYLYSIA 436, SYLYSIA 446, SYLYSIA 456, SYLYSIA 530, SYLYSIA 540, SYLYSIA 550, SYLYSIA 730, SYLYSIA 740, SYLYSIA 770, SYLOPHOBIC100, and SYLOPHOBIC 200 (Fuji Silysia Chemical Co., Ltd.); and Tismo-D, Tismo-L, Tofica Y, Tofica YN, Tofica YB, Dendol WK-200, Dendol WK-200B, Dendol WK-300, Dendol BK-200, Dendol BK-300, Swanite, and Barihigh B Super Dendol(Otsuka Chemical Co., Ltd.).

The inorganic fillers may also be surface treated with a silane coupling agent. Silane coupling agents which can be used for this purpose include vinyl triclorosilane, vinyl tris (β-methoxyethoxy) silane, vinyltriethoxy silane, vinyltrimethoxy silane, γ-(methacryloxypropyl) trimethoxy silane, β-(3,4-epoxycyclohexyl)ethyltrimethoxy silane, -glycydoxypropyltrimethoxy silane, γ-glycydoxypropylmethyl diethoxy silane, N-β(aminoethyl)yaminopropyltrimethoxy silane, N-β-(aminoethyl)-γ-aminopropylmethyldimethoxy silane, γ-aminopropyltriethoxysilane, N-phenyl-γ-amino propyl trimethoxy silane, γ-mercaptopropyl trimethoxysilane, and γ-chloropropyltrimethoxy silane. It is known in the art to which this invention applies that surface treatment of particles improves their resin/matrix compatibility.

The condition of the surface of the particles of the filler used and the impurities contained in filler from the fabrication process can affect the curing reaction of the composition. In such cases, it is preferable to wash the filler particles or coat the particles with an appropriate primer as a method of improving the curing properties. The inventors have also noted that certain fillers tend to contribute to a particularly marked reduction in viscosity stability. Without wishing to be bound by any particular theory, a hypothesized cause for this phenomenon is the presence of residual acids present amongst the particles of such fillers, which are an unwanted but often unavoidable byproduct of the manufacturing process used to create them. These residual acids will react with cationically polymerizable components in the surrounding resin, resulting in partial polymerization and an increase in viscosity over time.

The radiation curable composition for additive fabrication can include any suitable amount of inorganic filler or combination of fillers as component (e), for example, in an amount up to about 80 wt. % of the total composition, in certain embodiments from about 30 to about 80 wt. % of the composition, and in further embodiments from about 50 to about 70 wt. % of the composition. If the amount of the component (e) is too small, the water and heat resistant properties, durability, and structural rigidity of the molds made of the prepared composition do not increase sufficiently. On the other hand, if the amount of the component (e) is too large, the fluidity of the prepared composition becomes too low, rendering it difficult or even un-workable in additive fabrication processes. The excessive amount of the component (e) can also affect the time needed for radiation curing of the composition, causing the processing time to increase substantially.

Light Absorbing Components

As used herein, "light absorbing components" include those components which are added to a formulation to increase the amount of light absorbed by the entire composition at a certain wavelength, and which are not already characterized as a photoinitiator or photosensitizer.

Inventors have discovered multiple technical approaches to reduce surface reflection of high-intensity lasers which are directed at cured objects produced from compositions according to the present invention. Each of these approaches is focused in part on tailoring the composition such that it maximizes the amount of light absorption at the wavelength or wavelengths at which the laser in a particular PIV test emits radiation. In an embodiment where a "green" laser emits a radiation at a peak intensity of 532 nm, the composition used therewith will therefore have an absorbance maximized at this wavelength. By tuning a composition which is capable of significant absorption at the wavelength of light at which the laser in the PIV test operates ("NV wavelength" or "first wavelength"), the part created therefrom will tend to reduce surface reflection in the PIV test to a degree sufficient to enable accurate data collection to be taken in locations very close to the part surface. Many different types of colorant additives may be added into the composition to tune if for increased absorption at a particular wavelength. The feasible additives known further include pigments, laser dyes (or visible light absorbers), and photochemical latent dyes.

However, the radiation curable compositions of the current invention must also be suitable for use in various additive fabrication build processes. Therefore, not all light absorbing components which may otherwise reduce absorption at the PIV wavelength may be utilized in the current invention, because such components may also limit the ability of the composition to polymerize at the wavelength(s) at which the additive fabrication build process is carried out ("AF wavelength" or "second wavelength"). Black pigments, dyes, or other fillers effectively absorb the PIV wavelength but also tend block all UV-visible light (including the AF wavelength) and should be avoided in amounts sufficient to stymie curing in the additive fabrication process itself.

In a preferred embodiment, therefore, the light absorbing component(s) should meet several criteria: (1) strong absorption at the first wavelength with (2) low or zero fluorescent emission at the first wavelength; (3) low or no absorption at the second wavelength; and (4) no other tendency to inhibit the cure or reduce the cure speed of the associated radiation curable composition. The fourth criteria may not be met for additives which, despite having met all other criteria including possessing a minimal absorption at the second wavelength, are of an extremely alkaline nature which might inhibit or kill the photoacid species produced which are necessary for the cationic polymerization mechanism.

In preferred embodiments, any suitable light absorber, including inorganic pigments, photochemical latent dyes, and/or laser dyes meeting the above criteria may be incorporated for use in compositions of the current invention. The specific identity of the light absorber(s) used will depend upon the AF and PIV wavelengths with which the composition (or the part cured therefrom) will be associated.

Dyes which may be used include Leuco dyes, which are described in U.S. Pat. No. 6,031,021 and columns 52 and 53 of U.S. Pat. No. 5,470,816, each relevant section of which is hereby incorporated by reference in its entirety. Specific examples of such dyes include (1) Leuco bases of triphenylmethane dyes, such as 3,3-bis(p-dimethylaminophenyl)-phthalide, 3,3-bis(p-dimethylaminophenyl)-6-dimethylaminophthalide (or Crystal Violet Lacton), 3,3-bis(p-dimethylaminophenyl)-6-diethylaminophthalide, 3,3-bis(p-dimethylaminophenyl)-6-chlorophthalide, 3,3-bis(p-dibutylaminophenyl)-phthalide; (2) Leuco base of fluoran dyes, such as 3-cyclohexylamino-6-chlorofluoran, 3-(N,N-diethylamino)-5-methyl-7-(N,N-dibenzylamino)fluoran, 3-dimethylamino-5,7-dimethylfluoran, 3-diethylamino-7-methylfluoran, 3-diethylamino-5-methyl-7-t-butylfluoran; (3) Fluoran dyes, such as 3-diethylamino-7-chlorofluoran, 3-diethylamino-6-methyl-7-chlorofluoran, 3-pyrrolidino-6-methyl-7-chlorofluoran, 3-dimethylamino-6-methyl-7-anilinofluoran, 2-(N-(3'-trifluoromethylphenyl)amino)-6-diethylamino-fluoran, 3-diethylamino-7-cyclohexylaminofluoran, 2-(3,6-bis(diethylamino)-9-(o-chloroanilino)xyanthylbenzoic acid lactam), 3-dimethylamino-6-methyl-7-p-butylanilinofluoran, 3-diethylamino-6-methyl-7-anilinofluoran, 3-(N-ethyl-p-toluidino)-6-methyl-7-anilinofluoran, 3-(N-ethyl-N-isoamylamino)-6-methyl-7-anilinofluoran, 3-diethylamino-6-methyl-7-(o,p-dimethylanilino)fluoran, 3-pyrrolidino-6-methyl-7-anilinofluoran, 3-piperidino-6-methyl-7-anilinofluoran, 3-(N-cyclohexyl-N-methylamino)-6-methyl-7-anilinofluoran, 3-diethylamino-7-(m-trifluoromethylanilino)fluoran, 3-dibutylamino-6-methyl-7-anilinofluoran, 3-diethylamino-6-methyl-7-anilinofluoran, 3-dibutylamino-7-(o-chloroanilino)fluoran, 3-diethylamino-7-(o-chloroanilino)fluoran; (4) Lacton compounds, such as 3-(2'-hydroxy-4-dimethylaminophenyl)-3-(2'-methoxy-5'-chlorophenyl)phthalide, 3-(2'-hydroxy-4-dimethylaminophenyl)-3-(2'-methoxy-5'-nitrophenyl)phthalide 3-(2'-hydroxy-4-diethylaminophenyl)-3-(2'-methoxy-5'-methylphenyl)phthalide 3-(2'-hydroxy-4-dimethylaminophenyl)-3-(2'-hydroxy-4'-chloro-5'-methylphenyl)phthalide. Suitable such commercial examples include the Copikem® series of dyes.

For compositions wherein the PIV wavelength is 532 nm and the AF wavelength is 355 nm (the wavelength employed in many stereolithography machines), several specific examples of light absorbers may be used, including lithol red dispersions, photochemical latent dyes such as Copikem Magenta, and laser dyes, such as Rhodamine 6G, and combinations thereof.

In an embodiment, the light absorbing component comprises a compound defined by the following formula (III):

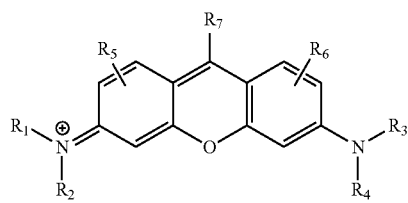

wherein $R_1$, $R_2$, $R_3$, $R_4$, $R_5$, and $R_6$, each independently represents a hydrogen atom, a substituted methyl or alkyl group, or an un-substituted methyl or alkyl group; and $R_7$ represents an un-substituted phenyl group or a substituted phenyl group. In a preferred embodiment, $R_7$ represents a benzoic ester group. In such case, the compound defined by formula (III) is called a fluorescein or rhodamine. The specific identity of the methyl or alkyl substituents $R_1$, $R_2$, $R_3$, $R_4$ $R_5$ and $R_6$ may be tailored as desired because such substituents are not expected to have a signfiicant impact upon the optical properties or absorbance of the dye with which they are associated.

In a preferred embodiment, the light absorbing component comprises a xanthene or rhodamine dye. Rhodamine dyes are known and are described in, i.a., U.S. Pat. Nos. 3,708,499, 3,767,358, and 3,849,065, each of which is hereby incorporated by reference in its entirety. A non-limiting listing of commercially available such dyes include Rhodamine 110, Rhodamine 6G, and Rhodamine B. Such dyes have the following molecular structures:

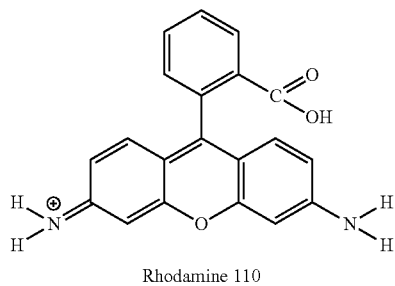
Rhodamine 110

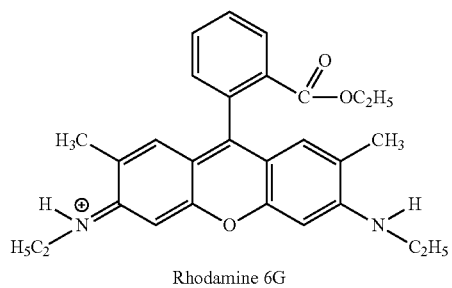
Rhodamine 6G

-continued

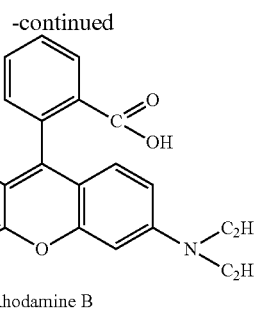
Rhodamine B

Inventors have discovered that although several known dyes, pigments, and other light absorbers described herein may be utilized effectively to impart sufficiently high desired absorbance values at the certain wavelength(s) of light used in particle image velocimetry tests, they similarly impart exceptionally high absorbance at the wavelength(s) of light used in the additive manufacturing processes required to convert them to test components. Because of this universally-high absorbance, light of all wavelengths—including the wavelength required to initiate the polymerization process—is prevented from penetrating the resin to sufficient depths. This has the effect of increasing the build time required for additive fabrication, either by necessitating a slower machine scanning speed, a smaller layer thickness, or both. In extreme cases, compositions with excessive absorbance values (at the relevant curing wavelength, at least) preclude the ability to create three-dimensional components via the additive fabrication processes entirely. Of course, the absorbance at the wavelength(s) used in the additive fabrication build process must not be too low, either, as in such case the material will not polymerize or yield cured objects at all. Inventors have surprisingly discovered that it is possible to synthesize and customize light absorbing components such that the radiation curable composition into which they are incorporated is specifically tailored and optimized simultaneously to: (1) maximize the absorbance of the three-dimensional component cured therefrom at the wavelength of light used in PIV testing, (2) limit the absorbance of the liquid radiation curable composition at the wavelength of light used in the additive manufacturing process itself, and (3) limit the cationic polymerization "chilling" effect by increasing acidity.

In an embodiment, the composition is configured such that it (or alternatively the test component cured therefrom) possesses an absorbance at a wavelength at which the light source in the particle image velocimetry test operates that is at least 10, or at least 15, or at least 20, or at least 25, or at least 30, or from 10-1000, or from 15-500, or from 20-200, or from 25-150, or from 30-100, or from 30-80, or from 35-75.

In an embodiment, the composition is also configured such that it (or alternatively the test component cured therefrom) possesses an absorbance at a wavelength at which the light source in the additive fabrication process operates that is less than 100, or less than 80, or less than 60, or less than 50, or less than 45, or at least 25, or at least 35, or at least 39, or from 25-100, or from 25-80, or from 25-60, or from 25-50, or from 25-45, or from 35-100, or from 35-80, or from 35-60, or from 35-45, or from 35-50, or from 39-100, or from 39-80, or from 39-60, or from 39-50, or from 39-45.

In a preferred embodiment, the composition is also configured (or alternatively the test component cured therefrom)

such that the difference in absorbance between the peak wavelength at which the light source in the particle image velocimetry test operates and the peak wavelength at which the light source in the additive fabrication process operates is greater than −50, or greater than −40, or greater than −30, or greater than −20, or greater than −10, or greater than 0, or greater than 10, or greater than 20, or greater than 30, or greater than 50, or greater than 100, or greater than 150, or less than 200, or less than 150, or less than 100, or less than 50, or less than 30, or less than 20, or less than 10, or less than 0, or less than −10, or less than −20, or from about −50 to 200, or from about −40 to 200, or from about −30 to about 200, or from about −30 to about 150, or from about −30 to about 100, or from about −30 to about 80, or from about −30 to about 60, or from about −30 to about 30, or from about −30 to about 20, or from about −30 to about 10, or from about −30 to about 0, or from about −30 to about −10, or from about −20 to about 100, or from about −20 to about 80, or from about −20 to about 60, or from about −20 to about 30, or from about −20 to about 20, or from about −20 to about 10, or from about −20 to about 0, or from about −20 to about −10, or from about −10 to about 100, or from about −10 to about 80, or from about −10 to about 60, or from about −10 to about 30, or from about −10 to about 20, or from about −10 to about 10, or from about −10 to about 0.

In other preferred embodiments, the composition is also configured (or alternatively the test component cured therefrom) such that the difference in absorbance between the peak wavelength at which the light source in the particle image velocimetry test operates and the peak wavelength at which the light source in the additive fabrication process operates is between 0 and 150, or between 0 and 100, or between 0 and 50, or between 0 and 30, or between 10 and 150, or between 10 and 100, or between 10 and 50, or between 20 and 200, or between 20 and 100, or between 20 and 50.

In an embodiment, therefore, the composition comprises a light absorbing component that is modified to maximize absorbance at the wavelength to be used in PIV testing, and to minimize absorbance at the wavelength used in the additive fabrication process. In a preferred embodiment, particularly where the additive fabrication process is carried out using conventional additive fabrication light sources imparting radiation at 355 nm or 365 nm, and the PIV test is carried out using a laser emitting light at 532 nm, the light absorber is a fluoroantimony-modified compound. This compound is distinct from the associated the cationic photoinitiator, which is often fluoroantimony-based in such additive processes incorporating cationically polymerizable constituents. In an embodiment, the fluoroantimony-modified compound is a $SbF_6$-modified pigment, a $SbF_6$-modified laser dye, or a triarylmethane cationic dye.

In an embodiment, the light absorbing component comprises a compound defined by the following formula (IV):

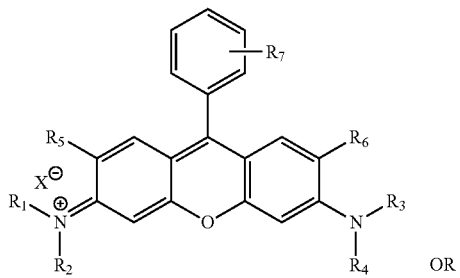

OR

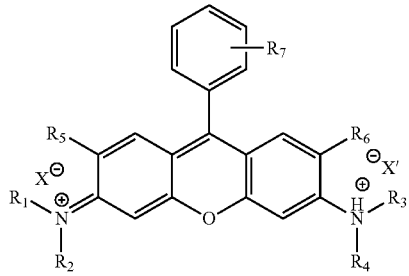

wherein

X and X' represents $Cl^-$, $Br^-$, $I^-$, $SO_4^{2-}$, $NO_3^-$, $ClO_4^-$, $AsF_6^-$, $SbF_6^-$, $PF_6^-$, $BF_4^-$, $(CF_3CF_2)_3PF_3^-$, $(C_6F_5)_4B^-$, $((CF_3)_2C_6H_3)_4B^-$, $(C_6F_5)_4Ga^-$, $((CF_3)_2C_6H_3)_4Ga^-$, trifluoromethanesulfonate, nonafluorobutanesulfonate, methanesulfonate, butanesulfonate, benzenesulfonate, or p-toluenesulfonate;

$R_1$, $R_2$, $R_3$, $R_4$, $R_5$ and $R_6$ each independently represent a hydrogen atom, a substituted methyl or alkyl group, or an un-substituted methyl or alkyl group; and $R_7$ represents a hydrogen atom, an un-substituted phenyl group, or a substitued phenyl group.

In an embodiment, X or X' of formula (IV) represents $Cl^-$, $Br^-$, $I^-$, $SO_4^{2-}$, $NO_3^-$, $ClO_4^-$, $AsF_6^-$, $SbF_6^-$, or $PF_6^-$, and preferably a hexafluoroantimony $(SbF_6)^-$ ion.

X or X' per formula (IV) may be tuned such that it matches the anion of the accompanying cationic photoinitiator. It is believed that matching the ions of the cationic photoinitiator and the modified light absorbing component facilitates rapid curing at the wavelength at which the additive fabrication process is carried out. In an embodiment, therefore the anion of the cationic photoinitiator is also represented by X or X' per formula (IV).

The above-listed light absorbing components can be used alone or in combinations of two or more. The radiation curable composition for additive fabrication can include any suitable amount or combination of light absorbing components listed above, for example, in an amount, relative to the weight of the entire composition, of up to about 25 wt. %, or up to about 10 wt. %, or up to about 5%, or greater than 0.005 wt. %, or greater than 0.01 wt. %, or greater than 0.1 wt. %, or greater than 0.5 wt. %, or greater than 1 wt. %, or from 0.005 wt % to about 5 wt %, or from 0.01 wt. % to about 5 wt. %, or from 0.005 wt. % to about 0.5 wt %.

Stabilizers and Other Additives

Stabilizers are often added to the compositions in order to further prevent a viscosity build-up, for instance a viscosity build-up during usage in a solid imaging process. Useful stabilizers include those described in U.S. Pat. No. 5,665,792, the entire disclosure of which is hereby incorporated by reference. In the instant claimed invention, the presence of a stabilizer is optional. In a specific embodiment, the radiation curable composition for additive fabrication comprises from 0.1 wt % to 3% of a stabilizer.

If present, such stabilizers are usually hydrocarbon carboxylic acid salts of group IA and IIA metals. Most preferred examples of these salts are sodium bicarbonate, potassium bicarbonate, and rubidium carbonate. Solid stabilizers are generally not preferred in filled compositions. If present, a 15~23% sodium carbonate solution is preferred for formulations of this invention with recommended amounts varying between 0.05 to 3.0% by weight of composition, more preferably from 0.05 to 1.0 wt. %, more preferably from 0.1 to 0.5% by weight of composition. Alternative stabilizers include polyvinylpyrrolidones and polyacrylonitriles.

Other possible additives include dyes, pigments, antioxidants, wetting agents, photosensitizers for the free-radical photoinitiator, chain transfer agents, leveling agents, defoamers, surfactants and the like.

The radiation curable composition for additive fabrication of the invention can further include one or more additives selected from the group consisting of bubble breakers, antioxidants, surfactants, acid scavengers, pigments, dyes, thickeners, flame retardants, silane coupling agents, ultraviolet absorbers, resin particles, core-shell particle impact modifiers, soluble polymers and block polymers.

To be effective in wind tunnel applications, in an embodiment the filled composition is able to impart sufficient strength and stiffness into the three-dimensional solid objects which they form upon curing. Therefore, it is preferred that liquid radiation curable compositions for additive fabrication according to the present invention have a tensile modulus, after full cure with actinic radiation and a 60 minute UV and thermal postcure according to processes well-known in the art of additive fabrication and stereolithography (ASTM D638-14), of at least 6,000 MPa, more preferably at least about 8,000 MPa, and even more preferably at least about 10,000 MPa. In an embodiment of the present invention, the tensile modulus achieved is between about 8,000 MPa and about 12,000 MPa.

Additionally, the filled composition must be able to impart sufficient resilience and integrity into three dimensional solid objects which they form upon curing, even after exposure to high heat conditions. Thus, it is preferred that the liquid radiation curable composition for additive fabrication according to the present invention, after full cure with actinic radiation and 60 minute UV and thermal postcure according to processes well-known in the art of additive fabrication and stereolithography (ASTM D648-16), has a heat deflection temperature at 1.82 MPa of at least about 80 degrees Celsius, more preferably at least about 100 degrees Celsius, and more preferably at least about 110 degrees Celsius. In an embodiment of the present invention, the heat deflection temperature at 1.82 MPa is between about 80 degrees Celsius and about 120 degrees Celsius.

The fourth aspect of the claimed invention is the three-dimensional object formed from the radiation curable composition of any one of the first three aspects of the present invention, by the any of the processes described or claimed herein.

The following examples further illustrate the invention but, of course, should not be construed as in any way limiting its scope.

Examples

These examples illustrate embodiments of the radiation curable compositions for additive fabrication of the instant invention. Table 1 describes the various components of the radiation curable compositions for additive fabrication used in the present examples.

TABLE 1

| Component | Function in Formula | Chemical Descriptor | Supplier/ Manufacturer |
|---|---|---|---|
| Somos ® PerFORM | Base resin (filled) | Proprietary blend of 25-50% silica particles, 15-35% epoxy, 2.1-11% multifunctional acrylate, 1-5% cationically curable monomer, 0.1-10% cationic photoinitiator, 0.1-5% free radical photoinitiator, <5% additives; $A_{355}$ = 39.47; $A_{405}$ = 3.09; $A_{532}$ = 2.19 | DSM |
| Somos ® Protogen 18120 | Base resin (clear) | Proprietary blend of 50-75% cationically curable monomers, 10-25% multifunctional acrylate, 5-20% polyol, 1-5% cationic photoinitiator, 1-5% free-radical photoinitiator, <5% additives | DSM |
| V952 Red Dispersion | Light absorbing component (pigment) | Lithol red (Red 57:1) dispersed in acrylate monomer | DSM |
| Rhodamine 6G | Light absorbing component (laser dye) | "Basic red 1"; CAS 989-38-8 | Sigma-Aldrich |
| Rhodamine B | Light absorbing component (laser dye) | "Basic Violet 10"; CAS 81-88-9 | Sigma-Aldrich |
| Custom Laser Dye 1 | Light absorbing component | $SbF_6$-Modified Rhodamine 6G | Custom |
| Custom Laser Dye 2 | Light absorbing component | $SbF_6$-Modified Rhodamine B | Custom |
| COPIKEM ® 14 Orange | Light absorbing component (cyclic lactone dye precursor) | substituted phthalide | DyStar Hilton Davis |
| COPIKEM ® 35 Magenta | Light absorbing component (cyclic lactone dye precursor) | 3-[Butyl-2-methylindol-3-yl]-3-(1-octyl-2-methylindol-3-yl)-1(3H)isobenzofuranone | DyStar Hilton Davis |
| Custom Triarylmethane Cationic Dye 1 | Light absorbing component | $SbF_6$-Modified Magenta | Custom |
| Custom Triarylmethane Cationic Dye 2 | Light absorbing component | Cl-Modified Magenta | Custom |

Synthesis of Custom Components

Custom Laser Dye 1 was synthesized by first dissolving 5.0 grams (0.01044 mol) of the laser dye Rhodamine 6G (LC5900, Molecular weight (Mw) of 479.02) into 100 milliliters of dichloromethane ($CH_2Cl_2$). Next, 3.67 g (1.36 times) of $NaSbF_6$ (Mw of 258.7) was dissolved in 100 mL of deionized water. The two solutions were then mixed for 2 hours using a magnetic stirrer at a stirring speed in the range of 5-7 (model RCT. B. S1 from IKA® Works, Inc). The resulting organic layer was extracted by removing the solvent with a rotary evaporator, followed by a vacuum step according to standard methods to yield 6.6 g of the red solid dye $SbF_6$ salt known herein as "Custom Laser Dye 1."

Custom Laser Dye 2 was synthesized by dissolving 5.0 g (0.01044 mol) of the laser dye Rhodamine B (LC6100, Mw of 479.02) into 100 mL of dichloromethane. Next, 3.67 g (1.36 times) of $NaSbF_6$ (Mw of 258.7) was dissolved in 100 mL of deionized water. The two solutions were then mixed for 2 hours using a magnetic stirrer at a stirring speed in the range of 5-7 (model RCT. B. S1 from IKA® Works, Inc). The resulting organic layer was extracted by removing the solvent with a rotary evaporator, followed by a vacuum step according to standard methods to yield 6.5 g of the red solid dye $SbF_6$ salt known herein as "Custom Laser Dye 2."

Custom Triarylmethane Cationic Dye 2 (Cl-Modified Magenta) was synthesized by dissolving 5.0 g (0.00992 mol) of COPIKEM® 35 Magenta (Mw of 504) into 100 mL of dichloromethane, after which 100 mL of 0.12 N (mole per liter) HCl solution (0.012 mol) was then added, by mixing for 2 hours using a magnetic stirrer at a stirring speed in the range of 5-7 (model RCT. B. S1 from IKA® Works, Inc). The resulting solution was left overnight at room temperature (20-25 degrees Celsius). 50% of the resulting organic layer was extracted by removing the solvent with a rotary evaporator, followed by a vacuum step according to standard methods to yield 2.4 g of the red solid dye chloride salt known herein as Custom Triarylmethane Cationic Dye 2. The remaining 50% of the organic layer was used in the preparation of Custom Triarylmethane Cationic Dye 1.

Custom Triarylmethane Cationic Dye 1 ($SbF_6$-Modified Magenta) was synthesized by providing the portion of Custom Triarylmethane Cationic Dye 2 specified above (0.00496 mol) and dissolving in 50 mL of dichloromethane. Next, 1.55 g of $NaSbF_6$ (Mw of 258.7) was dissolved in 50 mL of deionized water. The two solutions were then mixed for 2 hours using a magnetic stirrer at a stirring speed in the range of 5-7 (model RCT. B. S1 from IKA® Works, Inc). The resulting organic layer was extracted by removing the solvent with a rotary evaporator, followed by a vacuum step according to standard methods to yield 3.2 g of the red solid dye antimonate salt known as Custom Triarylmethane Cationic Dye 1.

Examples

Various filled radiation curable compositions for additive fabrication were prepared according to well-known methods in the art, employing a hybrid cure photoinitiating package, a cationically polymerizable package, a radically polymerizable package, and select additives. The compositions relied upon a control "base" resin of Somos® PerFORM, whereas a multitude of various light absorbing components in varying quantities were included.

These samples were tested according to the methods for absorbance at three different wavelengths (532 nm, 405 nm, and 355 nm) as detailed further below. Additionally, where data is provided, the various compositions were evaluated according to a working curve measurement (to determine Critical Energy, Ec, and Depth of Penetration, Dp). Next, the cure speed of each composition was evaluated according to reacted epoxide and reacted acrylate parameters. Finally, the qualitative results of each sample according to the particle image velocimetry (PIV) test is described and reported below. The results are depicted in Table 3.

Viscosity

Although not recorded herein, the viscosity of each sample may be taken with an Anton Paar Rheoplus Rheometer (S/N 80325376) with a spindle using a Z3/Q1 measuring cylinder (S/N 10571) with a 25 mm diameter. The temperature may be set at 30° Celsius with a shear rate of 50 $s^{-1}$. The rotational speed may be set at 38.5 $min^{-1}$. The measuring container may be a H-Z3/SM cup (diameter 27.110 mm) which would be filled with approximately 21 grams of sample (enough to the spindle). Measurements may be recorded in millipascal-seconds (mPa·s).

Absorption Calculations ($A_{355}$, $A_{405}$, and $A_{532}$)

For a specified wavelength, the absorbance A of a formulation (unitless) was calculated according to the relevant expression of the Beer-Lambert law, in accordance with the following formula:

$$A_X = C_1\varepsilon_1 L + C_2\varepsilon_2 L + C_3\varepsilon_3 L + \ldots + C_n\varepsilon_n L$$

where x equals the wavelength at which absorption values are desired (as indicated herein, $A_{355}$ indicates absorption at 355 nanometers, $A_{405}$ for 405 nm, and $A_{532}$ for 532 nm);

C is the molar concentration of the respective component of the formulation being evaluated;

ε is the absorption coefficient (also known as absorptivity) of the respective component of the formulation being evaluated at the wavelength X;

L is the thickness of cuvette used to take the UV spectrum measurement; and 1, 2, 3 . . . n represents an identifier for each respective component of the formulation being evaluated.

For purposes herein, only calculations for the following components (if present) were included in the determination of absorbance values: the photoinitiator, the photosensitizer, and any light absorbing components (including, but not necessarily limited to pigments, dyes, laser dyes, cyclic lactone dye precursors, custom or modified laser dyes, and custom triarylmethane cationic dyes). The other components in the formulation, such as cationically polymerizable monomers, free-radically polymerizable monomers, and silica fillers, were intentionally excluded from the calculation.

Absorption coefficients for some materials at certain wavelengths in certain solvents are known, but for purposes herein, E values were determined experimentally via UV/Vis spectroscopy. To do this, the UV-Vis absorbance of each sample was taken with a Perkin-Elmer Model Lambda 900 (S/N101N2101201) spectrophotometer using a 1.0 cm path of cuvette quartz cell in accordance with ASTM E169-04, and scanning the spectrum over the wavelength range of 850 to 250 nm. ε values was calculated from absorbance data. The measuring cell was filled at a concentration low enough to ensure that the observed absorbance did not exceed 1.0 in the range of the spectrum for which absorbance values were desired. Accordingly, for the Examples noted in Tables 2 and 3 herein, individual components were evaluated by dissolving the following concentrations in 100 mL of acetonitrile (MeCN):

for V952 Red Dispersion: 2.0×10⁻⁴ g/mL;

for Custom Triarylmethane Cationic Dye 1 & 2: 5.6×10⁻⁶ g/mL; and for Rhodamine 6G, Rhodamine B and Custom Laser Dyes 1 and 2: 3.0×10⁻⁶ g/mL.

Absorptivity ε at wavelength 355 nm, 405 nm and 532 nm for each photoinitiator, dye or pigment was then recorded and used in the calculation using the formula for determining absorbance as described above. Overall absorbance values were determined by adding the values for the relevant added light absorbing components to the value reported for the base resin (Somos® PerFORM; as reported above by the manufacturer in Table 1 and recorded below in Table 3 herein). By way of example, absorbance values at 355 nm for Comparative Example 2 (which constituted 50 parts of PerFORM plus 0.030 parts of Copikem Orange) were determined as follows:

$A_{355} = C_{PerFORM} \times \varepsilon_{PerFORM} \times L + C_{CopikemOrange} \times \varepsilon_{CopikemOrange} \times L \rightarrow A_{355} = 39.47$ (reported by manufacturer)+3.74 (derived per above procedure)=43.21

Working Curve Measurement

Working curve data ($E_c$, $D_p$, and $E_{10}$) was prepared using a solid-state laser operating at a wavelength of 354.7 nm in accordance with the below method.

The working curve is a measure of the photospeed of the particular material. It represents the relationship between the thickness of a layer of radiation curable composition produced as a function of the exposure given. For all formulations, the exposure-working curve of the formula is determined using methods well known in the art.

The exposure response for each formulation is measured using a 21.7 g sample of the formulation in a 100 mm diameter petri dish held at 30° C. and 30% RH. The surface of the formulation is exposed with the indicated light source. The exposures are made in half-inch squares (exposure regions) which are scanned out by drawing consecutive parallel lines approximately 25.4 microns apart on the surface of the liquid in the petri dish at 72 mW. Different exposure regions are exposed to different levels of known incident energy to obtain different cured thicknesses. The spot diameter at the liquid surface is approximately 0.0277 cm in diameter. After waiting at least 15 minutes for the exposed panels to harden, the panels are removed from the petri dish and excess, uncured resin is removed by blotting with a Kimwipe EX-L (Kimberly Clark). Film thickness is measured with a Mitutoyo Model ID-C 1 12CE Indicator Micrometer. Film thickness is a linear function of the natural logarithm of the exposure energy; the slope of the regression is $D_p$ (units of micron or mil) and $E_c$ is the x-axis intercept of the regression fit (units of mJ/cm²). $E_{10}$ is the energy required to cure a ten mil (254 micron) layer.

Cure Speed Measurements (Reacted Epoxide (10.0 min) % & Reacted Acrylate (50 ms) %)

To measure polymerization rate (cure speed) of each example, a Real Time Fourier Transform Infrared (FTIR) spectroscopy was used. Instead of transmission mode, an Attenuated Total Reflection (ATR) setup was used. All polymerization rate measurements were performed using the Thermo Scientific Nicolet Nexus model 470 or equivalent, equipped with a MCT detector. The Table below shows the experimental conditions setup for the measurement.

| | |
|---|---|
| Number of sample scans | 10 |
| Resolution | 4.000 cm⁻¹ |
| Data collection type | Real Time |
| Spectrum range | 4000-650 cm⁻¹ |
| Number of background scans | 32 |
| Final format | Absorbance |

For the cure speed measurements reported herein, samples were tested upon exposure to a solid-state laser operating at a peak wavelength of 355 nm. The laser actually used was a 100 mW solid state 355 nm Nd:YAG laser (Xcyte model CY-355-100 with power supply model CY-PS). The following steps were taken to enable the coupling of the 355 nm solid-state laser to the FTIR setup mentioned above: First, a housing was constructed which would fit over the FTIR sample compartment. Next, the laser was mounted towards the back of the top shelf with the laser output pointing toward and centered within the sample compartment. Then, a 1" hole was drilled in the top plate in a location so as to be centered over the diamond. With drilling complete, a movable flat mirror was installed over the hole to direct the laser beam to the diamond. Then a variable neutral density filter was installed in the path of the laser beam to enable intensity control. Next, the electronic shutter model Lambda SC SmartShutter with controller was installed in the laser beam path. Finally, the shutter driver software was installed on the FTIR computer.

With the solid-state laser coupled to the FTIR equipment, the light intensity was then selected at 22 mW/cm² (as measured by Gentec model TPM-300 Radiometer or equivalent) with the light exposure time being controlled to 25 milliseconds (ms).

For measurement, a couple of drops of selected sample are placed in the center of an ATR crystal setup. Then, an approximately 3 mil film (±0.4 mils) was coated on the top of an ATR crystal using a 3 mil (±0.4 mils) draw down bird bar. Immediately after application of the 3 mil coating, the real time FTIR scan was initiated. Once one spectrum A was obtained, the light source was turned on for 25 ms to start polymerization. A new spectrum B was obtained at 50 ms for acrylate conversion calculation, another new spectrum C was obtained at 10 mins for epoxy conversion calculation.

Polymerization conversion versus time was calculated based on the specific IR peak change representing each functional group. To calculate the conversion for each relevant functional group, first the peak area was calculated as appropriate according to the table below:

| Functional group | Method | Area (cm⁻¹) | Baseline (cm⁻¹) |
|---|---|---|---|
| Epoxy | Area | 927.608-879.395 | 927.608-879.395 |
| Acrylate | Area | 1419.375-1396.233 | 1419.375-1396.233 |

The peak area of the chosen peak for each spectrum was measured using the FTIR system's "peak area" software tool. Then, baseline points were set such that the baseline is as tangent as possible to the spectrum on either side of the peak. Next, the region points were set to the same values as the baseline points. Finally, the area was recorded.

In order to calculate the percent of each reacted species in each spectrum, the following equation was used:

$$\% \text{ Reacted Species} = \frac{A(liq) - A(\text{exposed})}{A(liq)} \times 100$$

wherein: A (liq)=net area of the peak for the liquid spectrum A; and

A (exposed)=net area of the peak after exposure.

Qualitative PIV Suitability Test

For this test, 50 g of each formulation was prepared according to standard methods, and DMA strips of each component was created on a Viper SLA machine (S/N 03FB0244 or S/N 02FB0160). In making the DMA strips, the Viper machine building platform was fixed at home position, to which a 6"×8" sheet of 10 mil Mylar film was laid on the platform and secured. Next, 5 mils of liquid resin was applied on the film by a Doctor blade by hand, after which the laser scanned over the liquid resin to build 4 pieces of DMA strips with the size of 4"×1.5". After this, a second 5 mils of liquid was applied on the top of the first cured layer by controlling 10 mils of blade gap, and then the liquid was cured to build second layer of DMA strips. This process was repeated until the six layers of DMA strips with thickness of 30 mil were completed. The green parts were then cleaned with IPA solvent and post-cured for 30 mins two separate times in a post-curing apparatus, after which they were aged in a temperature and humidity-controlled room (25° C. at 50% RH) for 7 days. The control sample (Somos® PerFORM) was built in the same way. For each example, a set of 4 DMA strips were built. No DMA strip was subsequently post-handled by adding a coating, foil, or paint thereto. Indeed, all DMA strips constituted components of a substantially homogeneous construction.

Then, each part was tested by firing a laser sheet at the test strip at a distance and under ambient conditions standard for PIV testing. An example of such a setup is depicted in FIG. 1. In such an exemplary setup, a laser 1 emits light at a PIV wavelength 2 through a lens 3. The lens, which is preferably a cylindrical lens, should distribute the light at the PIV wavelength broadly in a light sheet 4 which at least illuminates a target area 8. Meanwhile, the unfoiled, unpainted object 5, which is the cured product of radiation curable compositions according to the current invention, is then placed appropriately between imaging optics 7 and the target area. With the object 5 appropriately positioned, an airflow seeded with neutrally buoyant particles 6 which closely represent the fluid are directed into and across the object to generate a desired fluid flow pattern across one or more surfaces of the object. A charge-coupled device (CCD) image sensor 9 is then electrically coupled to the imaging optics to enable imaging to be taken of the airflow over the object 5. The raw imaging captured by the CCD 9 is then placed through correlation activities, whereupon the data is transformed and provided into a correlated/calibrated form 11. Finally, a data analysis is performed by a variety of software and analytical tools to draw conclusions about the relative performance of the airflow over or around the finished part for which the object 5 is deemed to be a sufficient proxy.

Turning to the actual test run, the laser used was a frequency-doubled Nd:YAG (neodymium-doped yttrium aluminum garnet; $Nd:Y_3Al_5O_{12}$) operating at a peak wavelength of 532 nm), with an image of the reflection recorded. The process was repeated 4 times; once for each respective DMA strip of each sample. The level of the intensity of the reflection was judged qualitatively. Parts were deemed to have "FAILED" if they exhibited no visually discernable difference in the image brightness and haziness exhibited by the control sample (which is already known in the industry to be insufficient for PIV testing without need for post-processing steps such as the addition of a coating, foil, or paint); parts which exhibited visually-observable improved clarity and a reduced reflection relative to the control were deemed to have "PASSED." If the results of the 4 tests were inconclusive or varied, they are deemed to have been "INCONCLUSIVE." "No data" is reported for each of the Examples for which this test was not run. The results are reported in Table 3 below.

TABLE 2

Amounts reported in parts by weight

| Internal ID # | PerFORM | V952 | Rhodamine 6G | Rhodamine B | Custom Laser Dye 1 | Custom Laser Dye 2 | COPIKEM® 14 Orange | COPIKEM® 35 Magenta | Custom Triarylmethane Cationic Dye 1 | Custom Triarylmethane Cationic Dye 2 |
|---|---|---|---|---|---|---|---|---|---|---|
| Comp. 1 | 50 | 0 | 0 | 0 | 0 | 0 | 0 | 0 | 0 | 0 |
| Comp. 2 | 50 | 0 | 0 | 0 | 0 | 0 | 0.030 | 0 | 0 | 0 |
| 1 | 50 | 0 | 0 | 0 | 0 | 0 | 0 | 0.0075 | 0 | 0 |
| 2 | 50 | 0 | 0 | 0 | 0 | 0 | 0 | 0.015 | 0 | 0 |
| 3 | 50 | 0 | 0 | 0 | 0 | 0 | 0 | 0.030 | 0 | 0 |
| 4 | 50 | 0 | 0 | 0 | 0 | 0 | 0 | 0.060 | 0 | 0 |
| 5 | 50 | 0.280 | 0 | 0 | 0 | 0 | 0 | 0 | 0 | 0 |
| 6 | 50 | 0.140 | 0 | 0 | 0 | 0 | 0 | 0 | 0 | 0 |
| 7 | 50 | 0 | 0 | 0 | 0 | 0 | 0 | 0 | 0.015 | 0 |
| 8 | 50 | 0 | 0 | 0 | 0.015 | 0 | 0 | 0 | 0 | 0 |
| 9 | 50 | 0 | 0 | 0 | 0 | 0.015 | 0 | 0 | 0 | 0 |
| 10 | 50 | 0 | 0 | 0.015 | 0 | 0 | 0 | 0 | 0 | 0 |
| 11 | 50 | 0 | 0.015 | 0 | 0 | 0 | 0 | 0 | 0 | 0 |
| 12 | 50 | 0 | 0 | 0 | 0.030 | 0 | 0 | 0 | 0 | 0 |
| 13 | 50 | 0 | 0 | 0 | 0 | 0 | 0 | 0 | 0.030 | 0 |
| 14 | 50 | 0 | 0 | 0 | 0 | 0 | 0 | 0 | 0 | 0.015 |
| 15 | 50 | 0 | 0.030 | 0 | 0 | 0 | 0 | 0 | 0 | 0 |

TABLE 3

| Example | $A_{335\,nm}$ | $A_{405\,nm}$ | $A_{532\,nm}$ | Ec | Dp | Reacted Epoxide (10.0 min) % | Reacted Acrylate (50 ms) % | Qualitative-Suitable in PIV test? |
|---|---|---|---|---|---|---|---|---|
| C.1 | 39.47 | 3.09 | 2.19 | 8.18 | 4.7 | 26.5 | 34.3 | FAIL |
| C.2 | 43.21 | 15.30 | 5.13 | Nd | Nd | 12.9 | 49.5 | FAIL |
| 1 | 40.62 | 4.14 | 10.87 | Nd | Nd | 26.2 | 51.1 | No data |
| 2 | 41.77 | 5.20 | 19.54 | Nd | Nd | 21.7 | 47.7 | No data |
| 3 | 44.06 | 7.31 | 36.89 | Nd | Nd | 9.3 | 49.6 | No data |
| 4 | 48.65 | 11.55 | 71.59 | Nd | Nd | 1.9 | 28.6 | No data |
| 5 | 54.14 | 18.98 | 35.93 | Nd | Nd | 28.6 | 41.4 | PASS |
| 6 | 46.81 | 11.04 | 19.06 | Nd | Nd | 30.7 | 45.8 | No data |
| 7 | 41.77 | 5.20 | 19.54 | Nd | Nd | 13.7 | 33.0 | PASS |
| 8 | 43.45 | 3.94 | 56.00 | 10.26 | 4.23 | 24.3 | 24.9 | PASS |
| 9 | 44.42 | 5.39 | 30.95 | Nd | Nd | 24.7 | 27.7 | PASS |
| 10 | 44.42 | 5.39 | 30.95 | Nd | Nd | 15.0 | 24.5 | PASS |
| 11 | 43.45 | 3.94 | 56.00 | 10.04 | 3.89 | 14.6 | 27.0 | PASS |
| 12 | 47.44 | 4.79 | 109.81 | 11 | 3.7 | 25.3 | 21.0 | PASS |
| 13 | 44.06 | 7.32 | 36.89 | Nd | Nd | 2.7 | 32.2 | PASS |
| 14 | 41.77 | 5.20 | 19.54 | Nd | Nd | 6.4 | 30.9 | No data |
| 15 | 47.44 | 4.79 | 198.81 | Nd | Nd | 7.8 | 19.5 | No data |

Nd = no data

Discussion of Results

These results demonstrate the superiority of compositions as described herein, in terms of simultaneous: suitability for producing cured components having adequate application-specific heat resistance and structural rigidity, a capability of producing parts that enable PIV testing with enhanced image resolution and without need for post-processing, and sufficient cure speed to ensure suitability in additive fabrication processes, such as stereolithography.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventor for carrying out the invention. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

While the invention has been described in detail and with reference to specific embodiments thereof, it will be apparent to one of ordinary skill in the art that various changes and modifications can be made therein without departing from the spirit and scope of the claimed invention.

What is claimed is:

1. A process of performing a particle imaging velocimetry test using an object created via additive fabrication, the method comprising:
   providing a test component created via additive fabrication;
   immersing the test component in a flow field seeded with tracer particles;
   illuminating at least a portion of said seeded flow field proximate to said component with light of a first wavelength;
   capturing a plurality of images using an imaging system;
   evaluating said images to determine flow vectors proximate to the test component;
   wherein the test component is uncoated, unfoiled, and unpainted,
   wherein the test component is a cured product of a radiation curable composition comprising a filler,
   and wherein the test component is the cured product of a composition comprising a compound defined by the following formula:

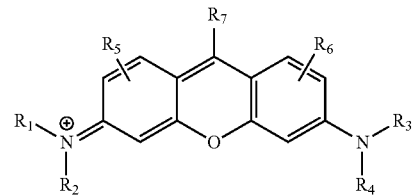

wherein $R_1$, $R_2$, $R_3$, $R_4$, $R_5$, and $R_6$ each independently represents a hydrogen atom, a substituted methyl or alkyl group, or an un-substituted methyl or alkyl group; and $R_7$ represents an un-substituted phenyl group or a substituted phenyl group.

2. The process of claim 1, wherein the test component created via additive fabrication possesses a tensile modulus, as determined by ASTM D638-14, from about 6 GPa to about 20 GPa, and a heat deflection temperature, as measured by ASTM D648-16 at 1.82 megapascals from about 65° C. to about 110° C.

3. The process of claim 1, wherein the test component is of a substantially homogeneous construction.

4. The process of claim 1, wherein the test component is the cured product of a composition comprising
a free-radical polymerizable monomer,
a free-radical photoinitiator,
a cationically polymerizable monomer, and
a cationic photoinitiator.

5. The process of claim 4, wherein the test component is the cured product of a composition comprising one or more light absorbing components.

6. The process of claim 5, wherein the test component is the cured product of a composition comprising a pigment, a laser dye, a cyclic lactone dye precursor, or combinations thereof.

7. The process of claim 5, wherein the test component is the cured product of a composition comprising a pigment and a laser dye, or a pigment and a cyclic lactone dye precursor.

8. The process of claim 5, wherein the test component is the cured product of a composition comprising a pigment, a laser dye, and a cyclic lactone dye precursor.

9. The process of claim 1, wherein $R_7$ represents a benzoic ester group.

10. The process of claim 1, wherein the test component is the cured product of a composition that was selectively exposed to actinic radiation at a second wavelength via the additive fabrication process.

11. The process of the claim 10, wherein the additive fabrication process is stereolithography, and the second wavelength is approximately 355 nanometers.

12. The process of claim 10, wherein the composition possesses a depth of penetration, when tested at the second wavelength, from 2.5-4.5.

13. The process of claim 10, wherein the illuminating step is carried out by a light source comprising a laser, and wherein the first wavelength of light is approximately 532 nanometers.

14. The process of claim 10, wherein the first wavelength is higher than the second wavelength, and wherein the difference between the first wavelength and the second wavelength is 120-180 nanometers.

15. The process of claim 14, wherein the test component possesses an absorbance at the first wavelength of light of at least 10.

16. The process of claim 15, wherein the test component possesses an absorbance at the second wavelength of light of less than 100, or from 25-80.

17. The process of claim 16, wherein the absorbance at first wavelength subtracted by the absorbance at the second wavelength of the test component is from about—50 to 200.

18. The process of claim 4, wherein the cationically polymerizable monomer comprises an epoxide, wherein the test component is the cured product of a composition which is configured to attain a % reacted epoxide (at 10.0 minutes) from about 10% to about 50%.

19. The process of claim 18, wherein the test component is the cured product of a composition which is configured to attain a % reacted acrylate (at 50 milliseconds) of at least about 20%.

* * * * *